(12) United States Patent
Nishi et al.

(10) Patent No.: US 11,868,033 B2
(45) Date of Patent: *Jan. 9, 2024

(54) WAVELENGTH CONVERSION ELEMENT AND LIGHT SOURCE MODULE AND PROJECTION DISPLAY DEVICE

(71) Applicant: Sony Group Corporation, Tokyo (JP)

(72) Inventors: Shota Nishi, Tokyo (JP); Izushi Kobayashi, Tokyo (JP); Yuki Maeda, Tokyo (JP); Masahiro Ishige, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 17/266,806

(22) PCT Filed: Aug. 7, 2019

(86) PCT No.: PCT/JP2019/031145
§ 371 (c)(1),
(2) Date: Feb. 8, 2021

(87) PCT Pub. No.: WO2020/044999
PCT Pub. Date: Mar. 5, 2020

(65) Prior Publication Data
US 2021/0341823 A1    Nov. 4, 2021

(30) Foreign Application Priority Data

Aug. 27, 2018 (JP) .................... 2018-158129
Feb. 27, 2019 (JP) .................... 2019-034421

(51) Int. Cl.
*G03B 21/16* (2006.01)
*G02B 26/00* (2006.01)
*G03B 21/20* (2006.01)

(52) U.S. Cl.
CPC ............ *G03B 21/16* (2013.01); *G02B 26/008* (2013.01); *G03B 21/204* (2013.01)

(58) Field of Classification Search
CPC ........ G03B 21/16; G03B 21/20; G03B 21/204; G02B 26/00; G02B 26/008
See application file for complete search history.

(56) References Cited

U.S. PATENT DOCUMENTS

2005/0168990 A1    8/2005  Nagata et al.
2008/0100807 A1*   5/2008  Fujii ................... G03B 21/16
                                                    181/175
(Continued)

FOREIGN PATENT DOCUMENTS

CN    1381765    11/2002
CN    1867863    11/2006
(Continued)

OTHER PUBLICATIONS

International Search Report prepared by the Japan Patent Office dated Oct. 28, 2019, for International Application No. PCT/JP2019/031145.

*Primary Examiner* — Magda Cruz
(74) *Attorney, Agent, or Firm* — SHERIDAN ROSS P.C.

(57) ABSTRACT

A wavelength conversion element according to an embodiment of the present disclosure includes: a phosphor layer; a refrigerant; a refrigerant transport member; and a housing. The phosphor layer includes a plurality of phosphor particles. The phosphor layer has a gap therein. The refrigerant cools the phosphor layer. The refrigerant transport member is provided in contact with the phosphor layer. The refrigerant transport member circulates the refrigerant. The phosphor layer, the refrigerant, and the refrigerant transport member are encapsulated in the housing.

27 Claims, 19 Drawing Sheets

(56) References Cited

U.S. PATENT DOCUMENTS

| | | | | |
|---|---|---|---|---|
| 2010/0066980 | A1* | 3/2010 | Tsuchiya | H04N 9/3105 353/57 |
| 2013/0044431 | A1 | 2/2013 | Koeneman | |
| 2014/0217272 | A1* | 8/2014 | Ramer | H01S 5/02423 250/238 |
| 2016/0238922 | A1 | 8/2016 | Furuyama et al. | |
| 2016/0291449 | A1* | 10/2016 | Masuda | F21V 29/502 |
| 2016/0348857 | A1* | 12/2016 | Miyata | F21V 9/38 |
| 2017/0074501 | A1* | 3/2017 | Ito | F21V 29/52 |
| 2018/0231880 | A1* | 8/2018 | Masuda | H04N 9/3158 |
| 2019/0146314 | A1* | 5/2019 | Yoshikawa | G03B 21/204 362/84 |

FOREIGN PATENT DOCUMENTS

| | | | |
|---|---|---|---|
| CN | 101144963 A | 3/2008 | |
| CN | 101535891 A | 9/2009 | |
| CN | 102147541 | 8/2011 | |
| CN | 102401280 | 4/2012 | |
| CN | 103090320 | 5/2013 | |
| CN | 103715344 | 4/2014 | |
| CN | 104102081 | 10/2014 | |
| CN | 104345531 | 2/2015 | |
| CN | 204287712 | 4/2015 | |
| CN | 106324956 | 1/2017 | |
| CN | 106410018 | 2/2017 | |
| CN | 106461274 A | 2/2017 | |
| CN | 106796387 A | 5/2017 | |
| CN | 106958753 A * | 7/2017 | |
| CN | 107193175 | 9/2017 | |
| CN | 107209302 A | 9/2017 | |
| CN | 107450261 | 12/2017 | |
| CN | 107577110 A | 1/2018 | |
| JP | 2004038105 A | 2/2004 | |
| JP | 2005-032658 | 2/2005 | |
| JP | 2005-070651 | 3/2005 | |
| JP | 2005-209959 | 8/2005 | |
| JP | 2007-087765 | 4/2007 | |
| JP | 2007-113863 | 5/2007 | |
| JP | 2011-075657 | 4/2011 | |
| JP | 2013-115364 | 6/2013 | |
| JP | 2017-027685 | 2/2017 | |
| JP | 2017168790 A * | 9/2017 | H01L 33/64 |
| JP | 2017-207673 | 11/2017 | |
| KR | 10-2009-0016321 | 2/2009 | |

* cited by examiner

WAVELENGTH CONVERSION ELEMENT AND LIGHT SOURCE MODULE AND PROJECTION DISPLAY DEVICE

CROSS REFERENCE TO RELATED APPLICATIONS

This application is a national stage application under 35 U.S.C. 371 and claims the benefit of PCT Application No. PCT/JP2019/031145 having an international filing date of 7 Aug. 2019, which designated the United States, which PCT application claimed the benefit of Japanese Patent Application Nos. 2018-158129 filed 27 Aug. 2018 and 2019-034421 filed 27 Feb. 2019, the entire disclosures of each of which are incorporated herein by reference.

TECHNICAL FIELD

The present disclosure relates to a wavelength conversion element including a phosphor particle and a light source module and a projection display device including the same.

BACKGROUND ART

Typical phosphor light sources each adopt a method in which a phosphor is fixed onto a wheel and the wheel is rotated to dissipate heat generated by laser radiation. Further, for example, PTL 1 discloses a phosphor wheel that increases the cooling efficiency of a phosphor by encapsulating a refrigerant along with the phosphor in a sealed housing provided on a rotation substrate.

CITATION LIST

Patent Literature

PTL 1: Japanese Unexamined Patent Application Publication No. 2017-27685

SUMMARY OF THE INVENTION

In this way, a wavelength conversion element including a phosphor as a light source is required to increase the cooling efficiency or heat dissipation characteristic of the phosphor.

It is desirable to provide a wavelength conversion element and a light source module and a projection display device that make it possible to increase a heat dissipation characteristic.

A wavelength conversion element according to an embodiment of the present disclosure includes: a phosphor layer; a refrigerant; a refrigerant transport member; and a housing. The phosphor layer includes a plurality of phosphor particles. The phosphor layer has a gap therein. The refrigerant cools the phosphor layer. The refrigerant transport member is provided in contact with the phosphor layer. The refrigerant transport member circulates the refrigerant. The phosphor layer, the refrigerant, and the refrigerant transport member are encapsulated in the housing.

A light source module according to an embodiment of the present disclosure includes: a light source section; and the above-described wavelength conversion element according to the embodiment of the present disclosure as a wavelength conversion element that is excited by excitation light from the light source section to emit fluorescent light.

A projection display device according to an embodiment of the present disclosure includes: a light source module including a wavelength conversion element; a light modulation element that modulates light emitted from the light source module; and a projection optical system that projects light from the light modulation element. The light source module mounted to this projection display device includes the same components as those of the above-described light source module according to the embodiment of the present disclosure.

In the wavelength conversion element according to the embodiment of the present disclosure and the light source module according to the embodiment and the projection display device according to the embodiment, the phosphor layer, the refrigerant, and the refrigerant transport member are encapsulated in the housing. The phosphor layer includes the plurality of phosphor particles and has the gap therein. The refrigerant cools the phosphor layer. The refrigerant transport member is provided in contact with the phosphor layer and circulates the refrigerant. This efficiently circulates the refrigerant in the phosphor layer.

BRIEF DESCRIPTION OF DRAWING

FIG. 30 is an outline diagram illustrating another example of the configuration of the light source module including the wavelength conversion element illustrated in FIG. 1 or the like.

FIG. 31 is an outline diagram illustrating another example of the configuration of the light source module including the wavelength conversion element illustrated in FIG. 1 or the like.

FIG. 32 is an outline diagram illustrating another example of the configuration of the light source module including the wavelength conversion element illustrated in FIG. 1 or the like.

FIG. 33 is an outline diagram illustrating an example of the configuration of the projector including the light source module illustrated in FIG. 4 or the like.

MODES FOR CARRYING OUT THE INVENTION

The following describes an embodiment of the present disclosure in detail with reference to the drawings. The following description is a specific example of the present disclosure, but the present disclosure is not limited to the following modes. In addition, the present disclosure does not also limit the disposition, dimensions, dimension ratios, and the like of respective components illustrated in the respective diagrams thereto. It is to be noted that description is given in the following order.

1. First Embodiment
(Example in which stacked phosphor layer and refrigerant transport member are encapsulated in housing along with refrigerant)
1-1. Configuration of Wavelength Conversion Element
1-2. Configuration of Light Source Module
1-3. Configuration of Projector
1-4. Workings and Effects
2. Second Embodiment
(Example in which there is provided space between side surface of phosphor layer stacked on refrigerant transport member and side surface of housing)
3. Third Embodiment
(Example in which refrigerant transport member is used that includes flow path on stacked surface with phosphor layer)
4. Modification Examples
4-1. Modification Example 1
(Example of transmissive wavelength conversion element including refrigerant transport member having open-cell porous structure)
4-2. Modification Example 2
(Example of transmissive wavelength conversion element including refrigerant transport member including flow path on stacked surface with phosphor layer)
4-3. Modification Example 3
(Example of reflective wavelength conversion element that is rotatable around rotation axis)
4-4. Modification Example 4
(Example of transmissive wavelength conversion element that is rotatable around rotation axis)
4-5. Modification Example 5
(Example in which light source is further disposed on back surface of storage section)
4-6. Modification Example 6
(Example in which side wall of storage section is sloped)
4-7. Modification Example 7
(Example in which storage section is further covered with cooling member)
5. Fourth Embodiment
(Example in which phosphor layer and cover glass are in contact with or are joined to each other)
5-1. Configuration of Reflective Wavelength Conversion Element
5-2. Configuration of Transmissive Wavelength Conversion Element
5-3. Other Configurations
5-4. Workings and Effects
6. Modification Example
(Other examples of light source module and projector)

1. First Embodiment

Figure 1:
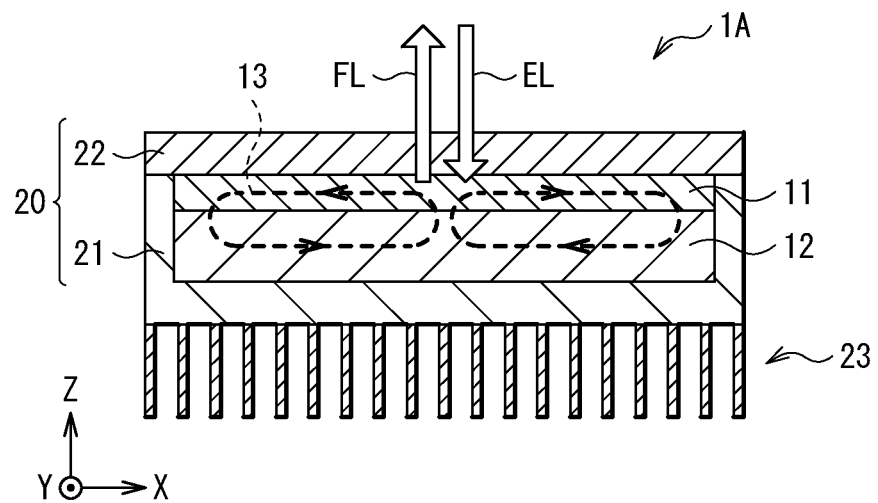
FIG. 1 is a cross-sectional schematic diagram illustrating an example of a configuration of a wavelength conversion element according to a first embodiment of the present disclosure.
Figure 2:
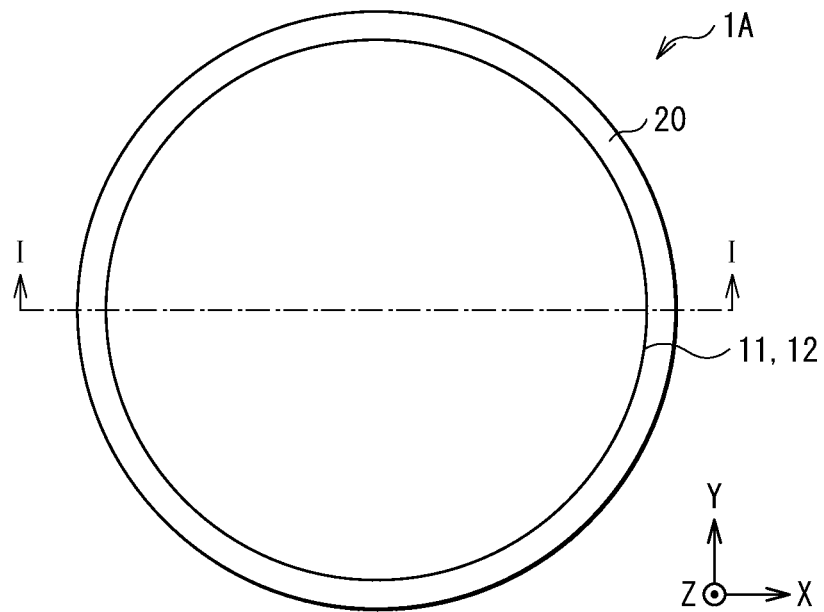
FIG. 2 is a plane schematic diagram of the wavelength conversion element illustrated in FIG. 1.

FIG. 1 schematically illustrates an example of a cross-sectional configuration of a wavelength conversion element (wavelength conversion element 1A) according to a first embodiment of the present disclosure. FIG. 2 schematically illustrates a plane configuration of the wavelength conversion element 1A illustrated in FIG. 1. FIG. 1 illustrates a cross-sectional configuration taken along an I-I line illustrated in FIG. 2. For example, this wavelength conversion element 1A is an example of a wavelength conversion element 1 (see FIGS. 4 and 5) included in a light source module (light source module 100) of a projection display device (projector 1000) described below. The wavelength conversion element 1A according to the present embodiment has a configuration in which a phosphor layer 11 and a refrigerant transport member 12 that are stacked are encapsulated in a housing 20 along with a refrigerant 13. The phosphor layer 11 is directly cooled by the latent heat of vaporization for the refrigerant 13.

1-1. Configuration of Wavelength Conversion Element

As described above, the wavelength conversion element 1A according to the present embodiment has a so-called two-phase cooling structure in which the phosphor layer 11 and the refrigerant transport member 12 are stacked and encapsulated in the housing 20 along with the refrigerant 13. The phosphor layer 11 is directly cooled by the latent heat of vaporization for the refrigerant 13. The housing 20 includes, for example, a storage section 21 and a cover glass 22. The phosphor layer 11, the refrigerant transport member 12, and the refrigerant 13 are stored in the storage section 21. The cover glass 22 has light transmissivity and seals the internal space of the storage section 21 in combination with the storage section 21. The housing 20 is further provided with a heat dissipation member 23 on the back surface of the storage section 21.

The phosphor layer 11 includes a plurality of phosphor particles. It is preferable that the phosphor layer 11 be formed, for example, as an open-cell porous layer. Although described in detail below, it is preferable that the size (average pore size) of each of the pores be smaller than the average pore size of the refrigerant transport member 12 that is also formed as an open-cell porous layer. For example, an average pore size of 10 μm or more and 30 μm or less is preferable. For example, it is preferable that the phosphor layer 11 be formed to have a plate shape. The phosphor layer 11 includes, for example, so-called ceramic phosphors or binder-type porous phosphors.

Each of the phosphor particles is a particle-shaped phosphor that absorbs excitation light EL radiated from a light source section 110 described below to emit fluorescent light FL. For example, as a phosphor particle, a fluorescent substance is used that is excited by laser light in the blue wavelength region (e.g., from 400 nm to 470 nm) to emit yellow fluorescent light (light in the wavelength region between the red wavelength region and the green wavelength region). Examples of such a fluorescent substance include an YAG (yttrium/aluminum/garnet)-based material. For example, phosphor particles have an average particle size of 10 μm or more and 100 μm or less. The phosphor layer 11 may further include semiconductor nanoparticles such as quantum dots and organic pigments.

The refrigerant transport member 12 carries the refrigerant 13 to the phosphor layer 11. It is preferable that the refrigerant transport member 12 be formed as an open-cell porous layer as with the phosphor layer 11. It is preferable that the average pore size of the refrigerant transport member 12 be greater than the average pore size of the phosphor layer 11.

The wavelength conversion element 1A according to the present embodiment is a so-called reflective wavelength conversion element that extracts the fluorescent light FL by reflecting the fluorescent light FL, for example, in the same direction as the direction in which the excitation light EL is inputted. The fluorescent light FL is emitted from the phosphor layer 11 irradiated with the excitation light EL. It is therefore preferable that the refrigerant transport member 12 further have light reflectivity. For example, the use of an inorganic material such as a metal material or a ceramic material is preferable. Examples of the material included in the refrigerant transport member 12 include a single metal such as aluminum (Al), copper (Cu), molybdenum (Mo), tungsten (W), cobalt (Co), chromium (Cr), platinum (Pt), tantalum (Ta), lithium (Li), zirconium (Zr), ruthenium (Ru), rhodium (Rh), or palladium (Pd) or an alloy including one or more of these. The refrigerant transport member 12 includes a sintered ceramic compact, a sintered metal, or a porous metal including, for example, the above-described material.

For example, as illustrated in FIG. 1, the refrigerant 13 circulates between the phosphor layer 11 and the refrigerant transport member 12 to cool phosphor particles heated by being irradiated with the excitation light EL. For example, it is preferable that liquid having great latent heat be used for the refrigerant 13. In addition, the refrigerant 13 circulates via gaps formed in the phosphor layer 11 and the refrigerant transport member 12. It is therefore preferable that the refrigerant 13 have low viscosity. Specific examples of the refrigerant 13 include water, acetone, methanol, naphthalin, benzene, and the like.

One surface of the housing 20 includes a material having light transmissivity. It is possible to form sealed space in the housing 20. The housing 20 includes the storage section 21 and the cover glass 22. The phosphor layer 11, the refrigerant transport member 12, and the refrigerant 13 are stored in the storage section 21. The cover glass 22 forms sealed space in combination with the storage section 21. This surface formed by using the cover glass 22 corresponds to the above-described one surface. The phosphor layer 11 and the refrigerant transport member 12 are stored in the storage section 21 to make the phosphor layer 11 face the cover glass 22 side. The housing 20 includes, for example, the following materials. For example, aluminum, copper, stainless steel, low-carbon steel, an alloy material thereof, and the like are used for the storage section 21. For example, in addition to a glass substrate, soda glass, quartz, sapphire glass, crystal, and the like are used for the cover glass 22. In addition, in a case where the light source section 110 outputs laser light with low power, it is possible to use resins and the like such as polyethylene terephthalate (PET), a silicone resin, polycarbonate, and acryl.

The opposite surface of the housing 20 to the one surface or the back surface of the storage section 21 is further provided with the heat dissipation member 23. The heat dissipation member 23 cools the storage section 21. This condenses the vapor of the refrigerant in the storage section 21 to bring about a phase change into liquid and the liquid is transported to the phosphor layer 11 by the refrigerant transport member 12. For example, a plurality of radiator fins is usable as the heat dissipation member 23 as illustrated in FIG. 1, but this is not limitative. For example, a Peltier element or a water cooling element may be used, for example, as the heat dissipation member 23.

As described above, the wavelength conversion element 1A according to the present embodiment has a two-phase cooling structure in which the stacked phosphor layer 11 and refrigerant transport member 12 are encapsulated in the housing 20 along with the refrigerant 13. Sealed space is formed in the housing 20. The phosphor layer 11 is directly cooled by the latent heat of vaporization for the refrigerant 13. To circulate the refrigerant 13 from the refrigerant transport member 12 to the phosphor layer 11, it is desirable that the capillary force generated in the phosphor layer 11 be greater than the capillary force generated in the refrigerant transport member 12. The capillary force is expressed by the following expression.

(Expression 1)

$$P = 2T \cos \theta / \rho g r \quad (1)$$

(P represents capillary force, T represents surface tension, $\theta$ represents a contact angle, $\rho$ represents the density of liquid, g represents gravitational acceleration, and r represents a capillary radius)

The equivalent capillary radius of the refrigerant transport member 12 is proportional to the average pore size. To make the capillary force of the phosphor layer 11 greater than the capillary force of the refrigerant transport member 12, it is desirable from the above-described expression (1) that the average pore size of the refrigerant transport member 12 be greater than the average pore size of the phosphor layer 11. In addition, as indicated by expression (1), one of the phosphor layer 11 and the refrigerant transport member 12 that has a smaller contact angle has greater capillary force. It is therefore desirable that the materials included in the phosphor layer 11 and the refrigerant transport member 12 each have wettability.

It is to be noted that, in a case where the wavelength conversion element 1A according to the present embodiment stands upright for use, the capillary force of the refrigerant transport member 12 has to draw up the refrigerant 13 to the irradiated position (light emitting section) with the excitation light EL against gravity. Accordingly, in a case where $R_0$ represents the distance from the light emitting section to the outermost periphery (inner side surface of the storage section 21), it is desirable that capillary force P of the refrigerant transport member 12 satisfy P≥hydraulic head difference $R_0$ (mmH$_2$O). This does not, however, apply in a case where a wavelength conversion element is rotated for use as with a wavelength conversion element 1F described below.

Figure 3:
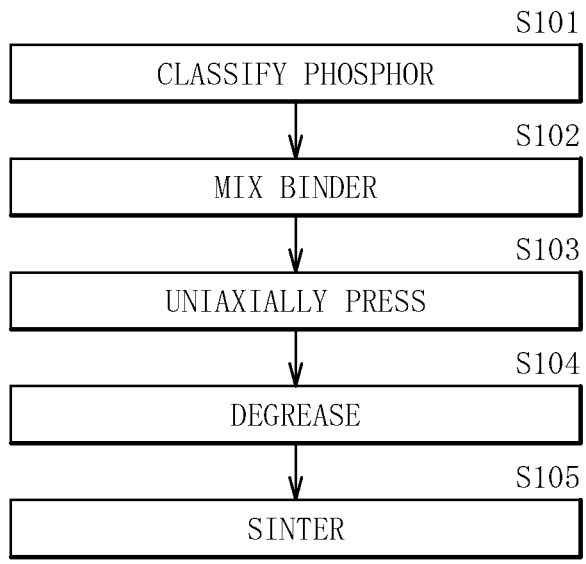
FIG. 3 is a flowchart of manufacturing steps of a phosphor layer.

In a case where the phosphor layer 11 and the refrigerant transport member 12 are each formed by using a sintered compact, controlling a predetermined parameter in the manufacturing steps of each sintered compact offers a desired average pore size. The following gives description by using a sintered phosphor as an example. FIG. 3 is a flowchart of manufacturing steps of a sintered phosphor. First, a phosphor is classified to control the particle size of the phosphor particle (step S101). The phosphor particle and a binder are then mixed together (step S102). Next, pressing pressure is controlled to perform uniaxial press (step S103). Subsequently, degreasing is performed (step S104) and sintering is then performed (step S105). As described above, the phosphor layer 11 including a sintered phosphor is formed. It is possible to adjust the average pore size of sintered phosphors at a desired value by classifying phosphors in step S101, controlling the pressing pressure for uniaxial press in step S103, and controlling the sintering temperature in step S105.

The cooling cycle of the wavelength conversion element 1A according to the present embodiment is described. First, when the phosphor layer 11 is irradiated with the excitation light EL, the phosphors generate heat. The refrigerant 13 is vaporized by this heat and concurrently takes latent heat away. In a case where the middle portion of the phosphor layer 11 is irradiated with the excitation light EL as illustrated in FIG. 1, the vaporized refrigerant 13 moves to the outer peripheral side of the phosphor layer 11 as vapor. The vapor that has moved to the outer peripheral side dissipates the latent heat via the inner wall of the storage section 21 and is liquidized again. The liquidized refrigerant 13 is transported to the phosphor layer 11 by the capillary force of the refrigerant transport member 12 and moved to the heated section of the phosphor layer 11 by the capillary force of the phosphor layer 11. The heat generated through the radiation of the excitation light EL is discharged to the refrigerant transport member 12 by repeating this.

1-2. Configuration of Light Source Module

Figure 4:
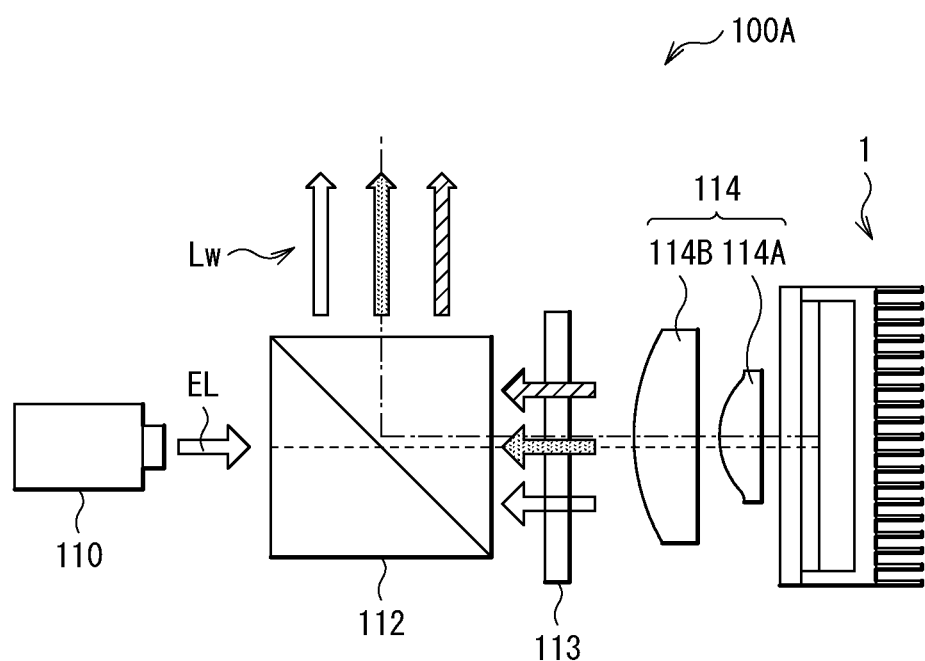
FIG. 4 is an outline diagram illustrating an example of a configuration of a light source module including the wavelength conversion element illustrated in FIG. 1.

FIG. 4 is an outline diagram illustrating an overall configuration of a light source module 100A. The light source module 100A includes the wavelength conversion element 1 such as the above-described wavelength conversion element 1A, the light source section 110, a polarizing beam splitter (PBS) 112, a quarter-wave plate 113, and a condensing optical system 114. The respective members included in the light source module 100A are disposed on an optical path of light (combined light Lw) emitted from the wavelength conversion element 1 in the order of the condensing optical system 114, the quarter-wave plate 113, and the PBS 112 from the wavelength conversion element 1 side. The light source section 110 is disposed at a position opposed to one light incidence surface of the PBS 112 in the direction orthogonal to the optical path of the combined light Lw.

The light source section 110 includes a solid-state light emitting element that emits light having a predetermined wavelength. In the present embodiment, a semiconductor laser element that oscillates the excitation light EL (e.g., blue laser light having a wavelength of 445 nm or 455 nm) is used as the solid-state light emitting element. The linearly-polarized (S-polarized) excitation light EL is emitted from the light source section 110.

It is to be noted that, in a case where the light source section 110 includes a semiconductor laser element, the excited light EL having predetermined power may be obtained by one semiconductor laser element, but the excited light EL having the predetermined power may be obtained by combining the pieces of light outputted from a plurality of semiconductor laser elements. Further, the wavelength of the excited light EL is not limited to the above-described numeric value. Any wavelength may be used as long as the wavelength falls within the wavelength band of light that is referred to as blue light.

The PBS 112 separates the excitation light EL inputted from the light source section 110 and the combined light Lw inputted from the wavelength conversion element 1. Specifically, the PBS 112 reflects the excitation light EL inputted from the light source section 110 toward the quarter-wave plate 113. In addition, the PBS 112 transmits the combined light Lw that is inputted from the wavelength conversion element 1 through the condensing optical system 114 and the quarter-wave plate 113. The transmitted combined light Lw is inputted to an illumination optical system 200 (described below).

The quarter-wave plate 113 is a phase difference element that causes inputted light to have a phase difference of $\pi/2$. In a case where the inputted light is linearly-polarized light, the linearly-polarized light is converted into circularly-polarized light. In a case where the inputted light is circularly-polarized light, the circularly-polarized light is converted into linearly-polarized light. In the present embodiment, the linearly-polarized excitation light EL emitted from the PBS 112 is converted by the quarter-wave plate 113 into the circularly-polarized excitation light EL. In addition, a circularly-polarized excitation light component included in the combined light Lw emitted from the wavelength conversion element 1 is converted by the quarter-wave plate 113 into linearly-polarized light.

The condensing optical system 114 condenses the excitation light EL emitted from the quarter-wave plate 113 in a predetermined spot diameter and emits the condensed excitation light EL toward the wavelength conversion element 1. In addition, the condensing optical system 114 converts the combined light Lw emitted from the wavelength conversion element 1 into parallel light to emit the parallel light toward the quarter-wave plate 113. It is to be noted that the condensing optical system 114 may include, for example, one collimating lens or may have a configuration in which inputted light is converted into parallel light by using a plurality of lenses.

It is to be noted that the configuration of an optical member that separates the excitation light EL inputted from the light source section 110 and the combined light Lw outputted from the wavelength conversion element 1 is not limited to that of the PBS 112. It is possible to use any optical member as long as the configuration thereof allows for the above-described light separating operation.

1-3. Configuration of Projector

Figure 5:
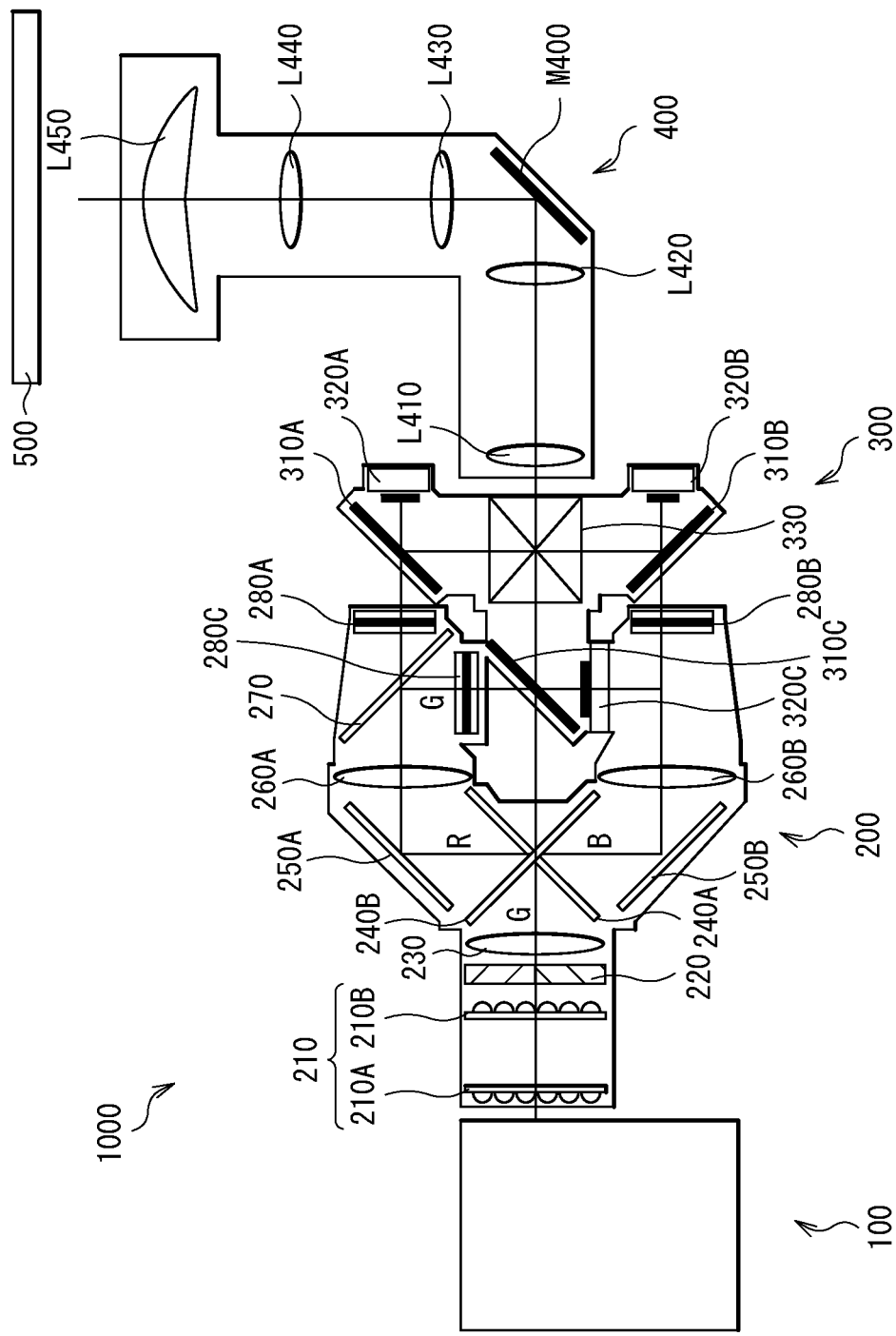
FIG. 5 is an outline diagram illustrating an example of a configuration of a projector including the light source module illustrated in FIG. 4.

Next, the projection display device (projector 1000) according to the present disclosure is described. FIG. 5 is an outline diagram illustrating an overall configuration of the projector 1000 including, for example, the light source module 100A illustrated in FIG. 4 as an example of the light source module 100 included in a light source optical system. It is to be noted that the following makes description by exemplifying a reflective 3LCD projector that performs light modulation by a reflective liquid crystal panel (LCD). It is to be noted that, instead of the reflective liquid crystal panel, the wavelength conversion element 1 may also be applied to a projector including a transmissive liquid crystal panel, a digital micro-mirror device (DMD: Digital Micro-mirror Device), or the like. A projector including a transmissive liquid crystal panel is described below.

As illustrated in FIG. 5, the projector 1000 includes the light source module 100, the illumination optical system 200, an image forming section 300, and a projecting optical system 400 (projection optical system) in order.

The illumination optical system 200 includes, for example, fly eye lenses 210 (210A and 210B), a polarization conversion element 220, a lens 230, dichroic mirrors 240A and 240B, reflecting mirrors 250A and 250B, lenses 260A and 260B, a dichroic mirror 270, and polarizing plates 280A to 280C from positions closer to the light source module 100.

The fly eye lenses 210 (210A and 210B) achieve uniform distribution of illumination of white light from the light source module 100. The polarization conversion element 220 functions to align the polarization axis of inputted light with a predetermined direction. For example, light other than P-polarized light is converted into P-polarized light. The lens 230 condenses light from the polarization conversion element 220 toward the dichroic mirrors 240A and 240B. The dichroic mirrors 240A and 240B each selectively reflect light in a predetermined wavelength region and selectively transmit the pieces of light in the other wavelength regions. For example, the dichroic mirror 240A mainly reflects red light in the direction of the reflecting mirror 250A. In addition, the dichroic mirror 240B mainly reflects blue light in the direction of the reflecting mirror 250B. Mainly green light thus passes through both of the dichroic mirrors 240A and 240B and travels toward a reflective polarizing plate 310C (described below) of the image forming section 300. The reflecting mirror 250A reflects light (mainly red light) from the dichroic mirror 240A toward the lens 260A and the reflecting mirror 250B reflects light (mainly blue light) from the dichroic mirror 240B toward the lens 260B. The lens 260A transmits light (mainly red light) from the reflecting mirror 250A and condenses the light to the dichroic mirror 270. The lens 260B transmits light (mainly blue light) from the reflecting mirror 250B and condenses the light to the dichroic mirror 270. The dichroic mirror 270 selectively reflects green light and selectively transmits the pieces of light in the other wavelength regions. Here, the dichroic mirror 270 transmits the red light component of light from the lens 260A. In a case where the light from the lens 260A includes a green light component, the green light component is reflected toward the polarizing plate 280C. The polarizing plates 280A to 280C each include a polarizer having a polarization axis in a predetermined direction. For example, in a case where light is converted into P-polarized light by the polarization conversion element 220, the polarizing plates 280A to 280C each transmit the P-polarized light and reflect S-polarized light.

The image forming section 300 includes reflective polarizing plates 310A to 310C, reflective liquid crystal panels 320A to 320C (light modulation elements), and a dichroic prism 330.

The reflective polarizing plates 310A to 310C respectively transmit pieces of light (e.g., pieces of P-polarized light) having the same polarization axes as the polarization axes of the pieces of polarized light from the polarizing plates 280A to 280C and reflect pieces of light (pieces of S-polarized light) having the other polarization axes. Specifically, the reflective polarizing plate 310A transmits P-polarized red light from the polarizing plate 280A in the direction of the reflective liquid crystal panel 320A. The reflective polarizing plate 310B transmits P-polarized blue light from the polarizing plate 280B in the direction of the reflective liquid crystal panel 320B. The reflective polarizing plate 310C transmits P-polarized green light from the polarizing plate 280C in the direction of the reflective liquid crystal panel 320C. In addition, the P-polarized green light that has passed through both of the dichroic mirrors 240A and 240B and has been inputted to the reflective polarizing plate 310C passes through the reflective polarizing plate 310C as it is and is inputted to the dichroic prism 330. Further, the reflective polarizing plate 310A reflects S-polarized red light from the reflective liquid crystal panel 320A and inputs the S-polarized red light to the dichroic prism 330. The reflective polarizing plate 310B reflects S-polarized blue light from the reflective liquid crystal panel 320B and inputs the S-polarized blue light to the dichroic prism 330. The reflective polarizing plate 310C reflects S-polarized green light from the reflective liquid crystal panel 320C and inputs the S-polarized green light to the dichroic prism 330.

The reflective liquid crystal panels 320A to 320C perform spatial modulation on red light, blue light, or green light, respectively.

The dichroic prism 330 combines red light, blue light, and green light that are inputted thereto and emits the combined light toward the projecting optical system 400.

The projecting optical system 400 includes lenses L410 to L450 and a mirror M400. The projecting optical system 400 enlarges light outputted from the image forming section 300 and projects the light onto a screen 500 or the like.

Operations of Light Source Module and Projector

Next, with reference to FIGS. 4 and 5, an operation of the projector 1000 including the light source module 100 (e.g., light source module 100A) is described.

First, the excitation light EL is oscillated from the light source section 110 toward the PBS. The excitation light EL is reflected by the PBS 112 and then passes through the quarter-wave plate 113 and the condensing optical system 114 in this order. The wavelength conversion element 1 is irradiated with the excitation light EL.

In the wavelength conversion element 1 (e.g., wavelength conversion element 1A), a portion of the excitation light EL (blue light) is absorbed in the phosphor layer 11 and is converted into light (fluorescent light FL; yellow light) in a predetermined wavelength band. The fluorescent light FL emitted from the phosphor layer 11 is diffused along with a portion of the excitation light EL that is not absorbed in the phosphor layer 11 and is reflected toward the condensing optical system 114 side. As a result, the fluorescent light FL and a portion of the excitation light EL are combined in the wavelength conversion element 1 to generate white light. This white light (combined light Lw) is outputted toward the condensing optical system 114.

Afterward, the combined light Lw passes through the condensing optical system 114, the quarter-wave plate 113, and the PBS 112 and is inputted to the illumination optical system 200.

The combined light Lw (white light) inputted from the light source module 100 sequentially passes through the fly eye lenses 210 (210A and 210B), the polarization conversion element 220, and the lens 230 and then reaches the dichroic mirrors 240A and 240B.

The dichroic mirror 240A mainly reflects red light. This red light sequentially passes through the reflecting mirror 250A, the lens 260A, the dichroic mirror 270, the polarizing plate 280A, and the reflective polarizing plate 310A and reaches the reflective liquid crystal panel 320A. This red light is subjected to spatial modulation at the reflective liquid crystal panel 320A and then reflected by the reflective polarizing plate 310A to be inputted to the dichroic prism 330. It is to be noted that, in a case where light reflected toward the reflecting mirror 250A by the dichroic mirror 240A includes a green light component, the green light component is reflected by the dichroic mirror 270 and sequentially passes through the polarizing plate 280C and the reflective polarizing plate 310C to reach the reflective liquid crystal panel 320C. The dichroic mirror 240B mainly reflects blue light. The blue light is inputted to the dichroic prism 330 through a similar process. The green light that has passed through the dichroic mirrors 240A and 240B is also inputted to the dichroic prism 330.

The red light, the blue light, and the green light inputted to the dichroic prism 330 are combined and then emitted toward the projecting optical system 400 as image light. The projecting optical system 400 enlarges image light from the image forming section 300 and projects the image light onto the screen 500 or the like.

1-4. Workings and Effects

Typical projection display devices each include a white-light source to project an image. In recent years, as this white-light source, a laser light source has been widely used that is small with long service life and powers on and off fast. Although a semiconductor laser is mainly used as a laser light source, the semiconductor laser is low in light emission efficiency for RG of RGB light sources necessary for a white-light source. A phosphor laser light source is therefore widely used that obtains white light by combining blue laser light and yellow excitation light. The yellow excitation light is obtained by exciting a phosphor with blue laser light. Phosphors, however, have a problem called temperature quenching and have lower light emission efficiency with an increase in temperature. To address this, typical phosphor laser light sources each have phosphors disposed on a rotatable wheel and rotates the wheel to diffuse heat generated through laser excitement and suppress the increasing temperature of the phosphors.

In recent years, projection display devices have been, however, required to be still higher in luminance and semiconductor lasers have been gaining higher power. In addition, the market is also thriving for small mobile projectors such as portable projectors. Light sources are required to be both higher in luminance and smaller in size.

To achieve light sources that are higher in luminance, it is conceivable to increase cooling efficiency to reduce the temperature quenching of phosphors. As described above, a phosphor wheel has been developed that increases the cooling efficiency of a phosphor by encapsulating a refrigerant along with the phosphor in a sealed housing provided on a rotation substrate. In this phosphor wheel, the phosphor portions are in the sealed structure and the coolant is encapsulated therein. The coolant is vaporized by the heat generated by excitation light. Afterward, the coolant is liquidized in the condensing section and circulated in the sealed structure by centrifugal force and capillary force generated in the phosphors. This cooling method, however, presupposes a phosphor wheel that rotates phosphors provided on the wheel and is not appropriate for miniaturization. In addition, in this phosphor wheel, there is provided a flow path (gaseous-phase flow path) between the condensing section and the phosphor layer. A reflective phosphor wheel may have decreased light extraction efficiency. Further, a rotary phosphor wheel causes the heated section of the phosphor layer to be located at the outer periphery and cases the cooled section to be located at the center. This limits the freedom of design.

In contrast, the wavelength conversion element 1A according to the present embodiment has the phosphor layer 11 and the refrigerant transport member 12 stacked therein. The phosphor layer 11 and the refrigerant transport member 12 each include a plurality of phosphor particles and have a gap therein. The wavelength conversion element 1A according to the present embodiment encapsulates these phosphor layer 11 and refrigerant transport member 12 in the housing 20 along with the refrigerant 13. This allows the refrigerant 13 to efficiently circulate in the phosphor layer 11. Here, the phosphor layer 11 is directly cooled by the latent heat of evaporation for the refrigerant 13. Heat transport using latent heat has about ten times as great heat transport performance as that of copper. This makes it possible to increase the cooling efficiency of the phosphor layer 11.

As described above, the wavelength conversion element 1A according to the present embodiment encapsulates the phosphor layer 11 and the refrigerant transport member 12 in the housing 20 along with the refrigerant 13. The phosphor layer 11 and the refrigerant transport member 12 each have a gap and are stacked. This allows the refrigerant 13 to efficiently circulate in the phosphor layer 11 and allows the phosphor layer 11 to be directly cooled by the latent heat of evaporation for the refrigerant 13. This increases the cooling efficiency of the phosphor layer 11 and makes it possible to increase the heat dissipation characteristic of the wavelength conversion element 1A.

In addition, the gaseous-phase flow path as described above is not provided between a phosphor layer and a reflecting member. This makes it possible to increase the light extraction efficiency. Further, in the above-described phosphor wheel, the reflecting member condenses the refrigerant. A droplet may therefore cause light to be scattered on the reflecting member. In the present embodiment, the reflecting member and a cohesion section are, however, different. This solves the generation of light scattering caused by a droplet.

Still further, as described above, the refrigerant 13 is circulated between the phosphor layer 11 and the refrigerant transport member 12 by the capillary force caused by gaps of the phosphor layer 11 and the refrigerant transport member 12. This makes it possible to circulate the refrigerant without forming the phosphor layer 11 and the refrigerant transport member 12 on the rotary wheel. It is thus possible as in the present embodiment to configure a non-rotary wavelength conversion element and miniaturize a phosphor laser light source.

Further, in the wavelength conversion element 1A according to the present embodiment, the increased heat dissipation characteristic makes it possible to efficiently reduce the peak temperature of a heat spot of the phosphor layer 11 irradiated with the excitation light EL. This makes it possible to increase the light emission efficiency of phosphor particles included in the phosphor layer 11. As described above, it is possible to provide the small and high-power wavelength conversion element 1A and the light source module 100 including this and the projector 1000.

Next, second to fourth embodiments and modification examples are described. The following assigns the same signs to components similar to those of the above-described first embodiment and omits descriptions thereof as appropriate.

2. Second Embodiment

Figure 6:
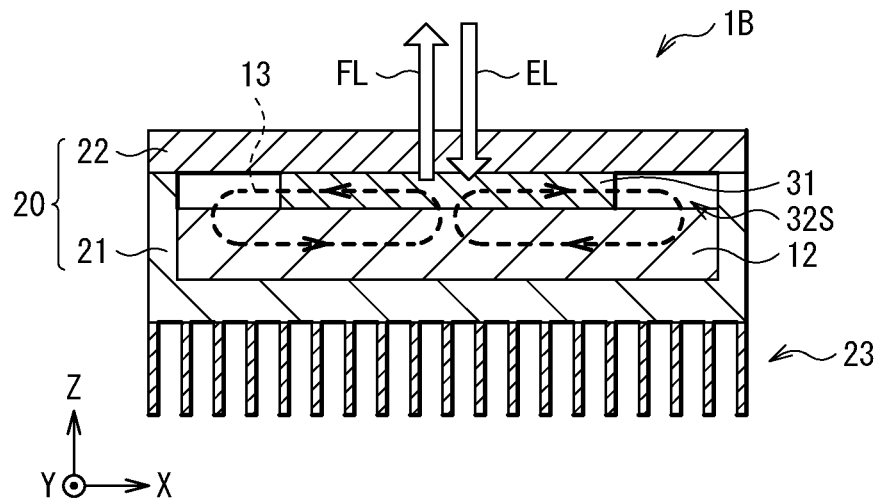
FIG. 6 is a cross-sectional schematic diagram illustrating an example of a configuration of a wavelength conversion element according to a second embodiment of the present disclosure.
Figure 7:
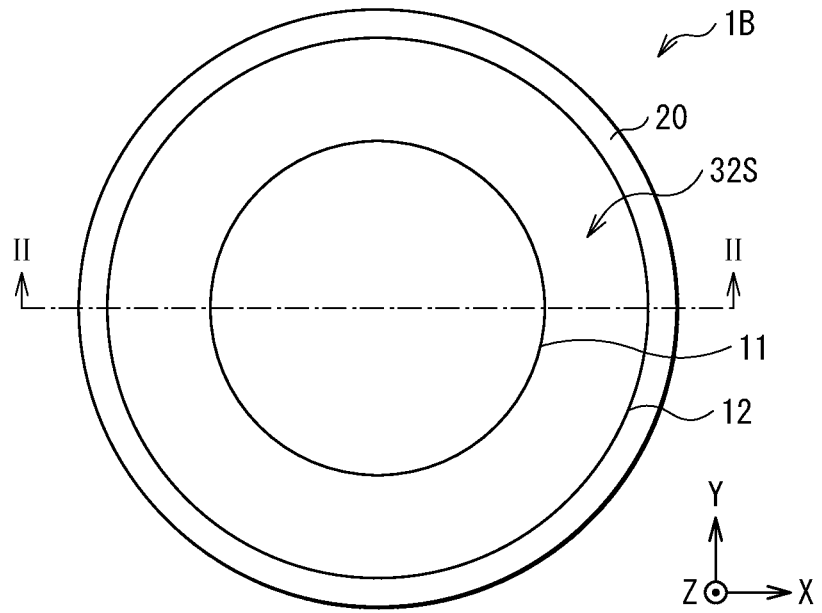
FIG. 7 is a plane schematic diagram of the wavelength conversion element illustrated in FIG. 6.

FIG. 6 schematically illustrates an example of a cross-sectional configuration of a wavelength conversion element (wavelength conversion element 1B) according to a second embodiment of the present disclosure. FIG. 7 schematically illustrates a plane configuration of the wavelength conversion element 1B illustrated in FIG. 6. FIG. 6 illustrates a cross-sectional configuration taken along an II-II line illustrated in FIG. 7. As with the above-described first embodiment, this wavelength conversion element 1B is an example of the wavelength conversion element 1 included in the light source module (light source module 100) of the projection display device (projector 1000). The wavelength conversion element 1B according to the present embodiment is different from the above-described first embodiment in that a phosphor layer 31 has a smaller diameter than that of the refrigerant transport member 12 and there is provided space (space 32S) between the side surface of the phosphor layer 31 and the side wall of the housing 20 as illustrated in FIG. 7.

The wavelength conversion element 1B according to the present embodiment is provided with space between the side surface of the phosphor layer 31 and the side wall of the housing 20 as described above. This discharges the refrigerant 13 vaporized in the phosphor layer 11 to the space 32S as vapor in the above-described cooling cycle of the wavelength conversion element 1A. The vapor discharged to the space 32S dissipates latent heat and is liquidized again in the refrigerant transport member 12.

As described above, in the present embodiment, the space 32S provided between the phosphor layer 31 encapsulated in the housing 20 and the side wall of the housing 20 causes the refrigerant 13 vaporized in the phosphor layer 31 to be discharged to the space 32S in which the side surface of the phosphor layer 31 has low flow path resistance. That is, the vapor flows at high speed and the refrigerant 13 has increased heat transport efficiency. This makes it possible to further increase the heat dissipation efficiency of the wavelength conversion element 1B.

3. Third Embodiment

Figure 8:
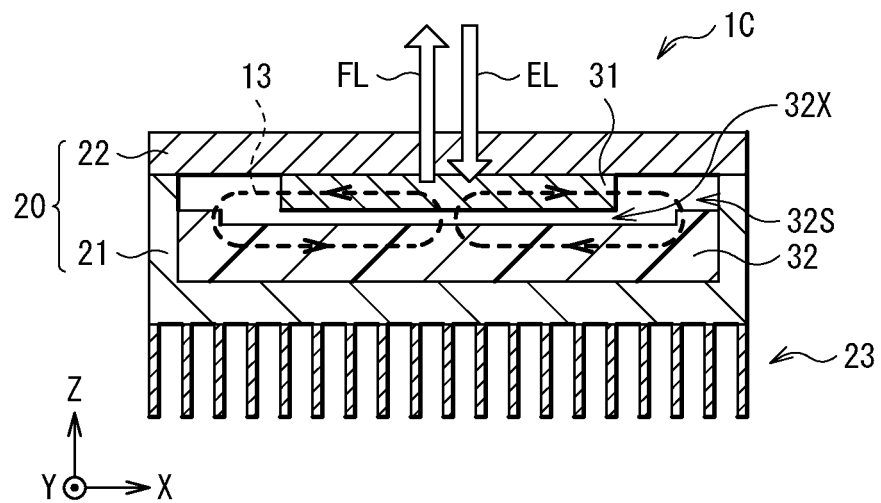
FIG. 8 is a cross-sectional schematic diagram illustrating an example of a configuration of a wavelength conversion element according to a third embodiment of the present disclosure.
Figure 9:
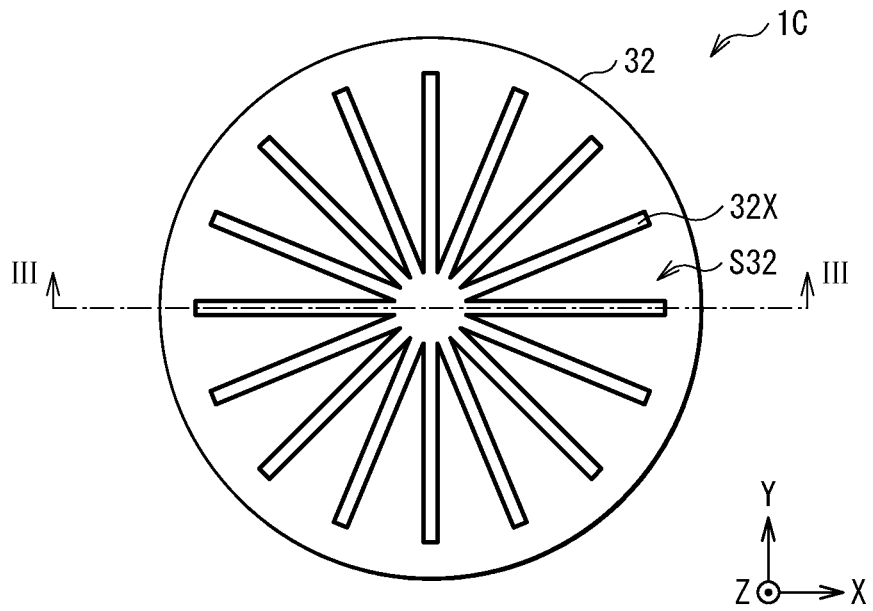
FIG. 9 is a plane schematic diagram illustrating an example of a refrigerant transport member illustrated in FIG. 8.

FIG. 8 schematically illustrates an example of a cross-sectional configuration of a wavelength conversion element (wavelength conversion element 1C) according to a third embodiment of the present disclosure. FIG. 9 schematically illustrates an example of a plane configuration of a refrigerant transport member 32 illustrated in FIG. 8. It is to be noted that the cross section of the refrigerant transport member 32 in FIG. 8 is taken along a line illustrated in FIG. 9. As with the above-described first embodiment, this wavelength conversion element 1C is an example of the wavelength conversion element 1 included in the light source module (light source module 100) of the projection display device (projector 1000). The wavelength conversion element 1C according to the present embodiment encapsulates the stacked phosphor layer 31 and refrigerant transport member 32 in the housing 20 along with the refrigerant 13 and is different from the above-described second embodiment in that the refrigerant transport member 32 includes a metal plate having minute flow paths 32X formed on the contact surface with the phosphor layer 31.

The refrigerant transport member 32 carries the refrigerant 13 to the phosphor layer 31. As described above, the refrigerant transport member 32 has the minute flow paths 32X formed on the contact surface with the phosphor layer 31. Grooves are formed through micromachining on a surface S1 (contact surface with the phosphor layer 31) of the refrigerant transport member 32 as the flow paths 32X. The grooves radially extend from the middle to the outer periphery of the refrigerant transport member 32, for example, as illustrated in FIG. 9. These flow paths 32X are each formed, for example, to have both a width and a depth of several tens of μm. This generates capillary force. It is to be noted that the flow paths 32X are formed to cause the refrigerant transport member 32 to have less capillary force than the capillary force of the phosphor layer 31 as with the first embodiment. In addition, FIG. 9 illustrates the example of the flow paths 32X radially extending from the middle to the outer periphery of the refrigerant transport member 32, but this is not limitative. For example, the flow paths 32X may be formed to have a lattice shape or a spiral shape.

It is preferable that a material having high wettability and hydrophilicity be used for a metal plate included in the refrigerant transport member 32. In addition, in a case where use as a light reflecting layer is taken into consideration, for example, the use of an aluminum (Al) substrate is preferable. In addition, it is possible to use a substrate such as a copper (Cu) substrate including an inorganic material mentioned as the above-described material included in the refrigerant transport member 12, but it is preferable in this case that a high-reflective film be formed on the surface.

As described above, in the present embodiment, the use of a metal plate including the flow paths 32X each having a predetermined size for the contact surface with the phosphor layer 31 as the refrigerant transport member 32 also makes it possible to obtain an effect similar to that of the above-described second embodiment.

It is to be noted that the flow paths 32X may be formed directly on the storage section 21. In that case, the storage section 21 also serves as a refrigerant transport member and it is thus possible to omit the refrigerant transport member 32. This makes it possible to reduce members included in the wavelength conversion element 1C and miniaturize (thin down) the wavelength conversion element 1C.

4. Modification Examples

4-1. Modification Example 1

Figure 10:
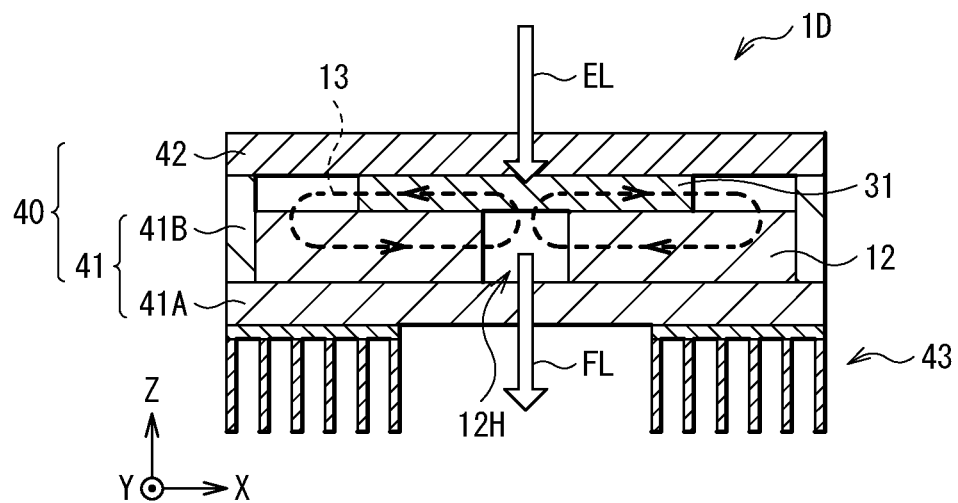
FIG. 10 is a cross-sectional schematic diagram illustrating an example of a configuration of a wavelength conversion element according to a modification example 1 of the present disclosure.

FIG. 10 schematically illustrates a cross-sectional configuration of a wavelength conversion element 1D according to a modification example 1 of the present disclosure. As with the above-described first embodiment, this wavelength conversion element 1D is an example of the wavelength conversion element 1 included in the light source module (light source module 100) of the projection display device (projector 1000). The wavelength conversion element 1D according to the present modification example is a so-called transmissive wavelength conversion element in which the fluorescent light FL emitted from the phosphor layer 31 passes through the phosphor layer 31 and is extracted from the opposite surface to the surface irradiated with the excitation light EL.

In the present modification example, the refrigerant transport member 12 is provided with an opening 12H in the region corresponding to the irradiated position of the phosphor layer 31 with the excitation light EL. A housing 40 includes a rear cover 41A and a side wall 41B and the rear cover 41A includes a material having light transmissivity. The side wall 41B may be formed by using the above-described material mentioned for the storage section 21 or may be formed by using materials similar to those of a cover glass 42 and the rear cover 41A. This causes the fluorescent light FL generated in the phosphor layer 31 to pass through this opening 12H, the rear cover 41A transmits the fluorescent light FL, and the fluorescent light FL is extracted. There is provided a heat dissipation member 43 in a region in which the heat dissipation member 43 does not prevent the fluorescent light FL from being extracted, for example, as illustrated in FIG. 10.

4-2. Modification Example 2

Figure 11:
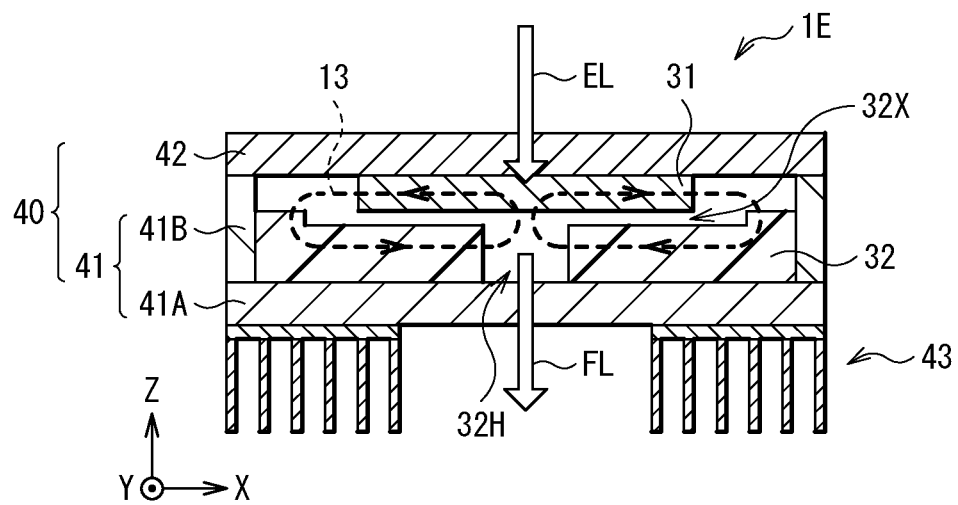
FIG. 11 is a cross-sectional schematic diagram illustrating an example of a configuration of a wavelength conversion element according to a modification example 2 of the present disclosure.

FIG. 11 schematically illustrates a cross-sectional configuration of a wavelength conversion element 1E according to a modification example 2 of the present disclosure. As with the above-described first embodiment, this wavelength conversion element 1E is an example of the wavelength conversion element 1 included in the light source module (light source module 100) of the projection display device (projector 1000). The wavelength conversion element 1E according to the present modification example is a so-called transmissive wavelength conversion element as with the above-described modification example 1 and is different from the above-described modification example 1 in that the refrigerant transport member 32 having the minute flow paths 32X formed on the contact surface with the phosphor layer 31 is used as a refrigerant transport member as with the above-described third embodiment.

The refrigerant transport member 32 is provided with an opening 32H in the region corresponding to the irradiated position of the phosphor layer 31 with the excitation light EL as with the refrigerant transport member 12 according to the above-described modification example 1. In addition, in the present modification example, the fluorescent light FL emitted from the phosphor layer 31 passes through the phosphor layer 31 and is extracted from the opposite surface from the surface irradiated with the excitation light EL. Therefore, the refrigerant transport member 32 does not necessarily have to have light reflectivity. The refrigerant transport member 32 may be therefore formed, for example, by using a material such as a glass substrate having light transmissivity in addition to the above-described material.

As described above, in the modification examples 1 and 2, the refrigerant transport members 12 and 32 are respectively provided with the openings 12H and 32H in the regions corresponding to the irradiated position of the phosphor layer 31 with the excitation light EL. In addition, the rear cover 41A of a storage section 41 includes a material having light transmissivity. This makes it possible to configure the transmissive wavelength conversion elements 1D and 1E that have effects similar to those of the above-described second embodiment.

It is to be noted that the surface of the rear cover 41A that abuts the opening 12H or 32H is preferably subjected to water repellent treatment or hydrophilic treatment to have water repellency or hydrophilicity. This prevents the rear cover 41A in the opening 12H or 32H from having a droplet or being fogged, making it possible to suppress a decrease in the transmittance for the fluorescent light FL. The fluorescent light FL passes through the openings 12H and 32H.

4-3. Modification Example 3

Figure 12:
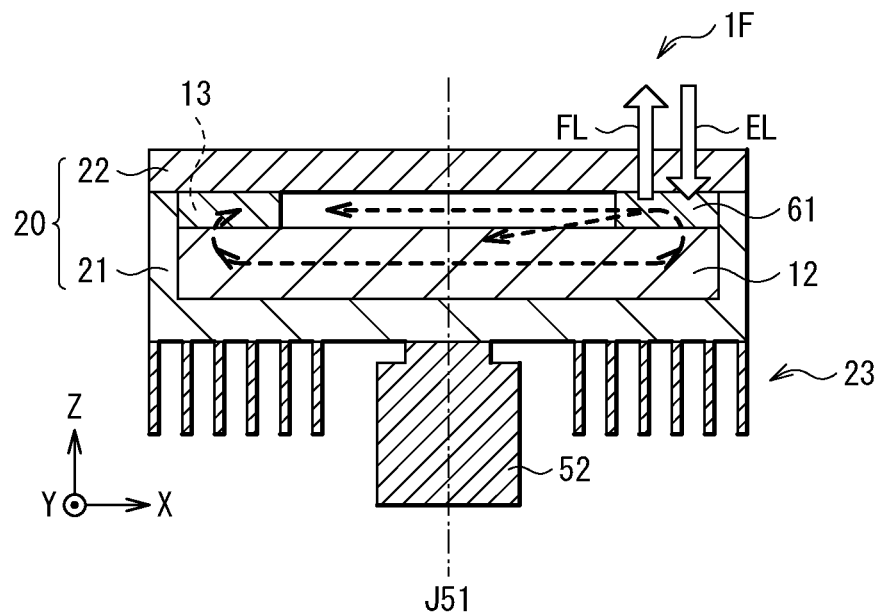
FIG. 12 is a cross-sectional schematic diagram illustrating an example of a configuration of a wavelength conversion element according to a modification example 3 of the present disclosure.
Figure 13:
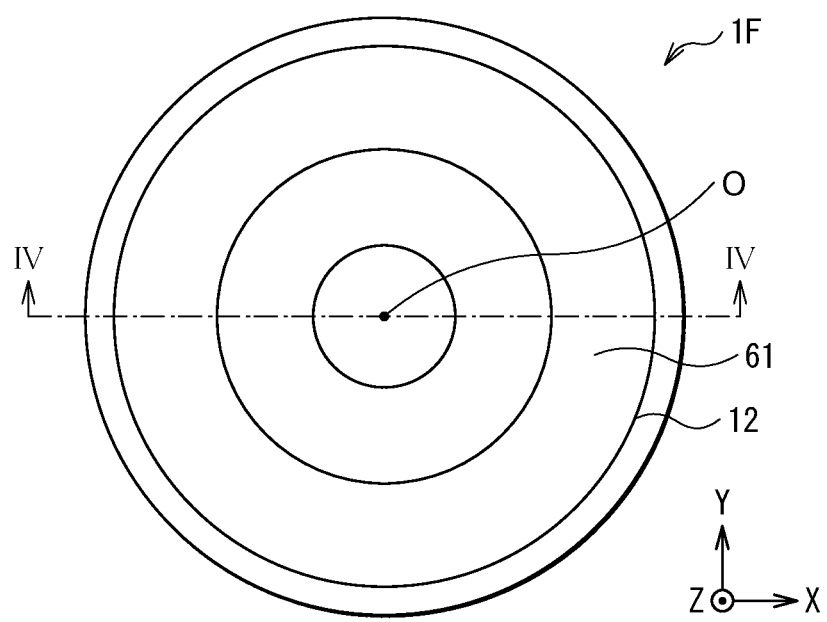
FIG. 13 is a plane schematic diagram of the wavelength conversion element illustrated in FIG. 12.

FIG. 12 schematically illustrates an example of a cross-sectional configuration of a wavelength conversion element (wavelength conversion element 1F) according to a modification example 3 of the present disclosure. FIG. 13 schematically illustrates a plane configuration of the wavelength conversion element 1F illustrated in FIG. 12. FIG. 12 illustrates a cross-sectional configuration taken along an IV-IV line illustrated in FIG. 13. As with the above-described first embodiment or the like, this wavelength conversion element 1F is an example of the wavelength conversion element 1 included in the light source module (light source module 100) of the projection display device (projector 1000). The wavelength conversion element 1F according to the present modification example is a so-called reflective phosphor wheel that is rotatable around a rotation axis (e.g., axis J51).

In the present modification example, a phosphor layer 61 is continuously formed in the rotating circumferential direction of the refrigerant transport member 12 having a circular shape, for example, as illustrated in FIG. 13. In other words, the phosphor layer 61 is formed, for example, to have an annular shape.

The housing 20 according to the present modification example is a wheel member. For example, a motor 52 is attached to the housing 20. The motor 52 drives and rotates the wavelength conversion element 1F at predetermined rotation speed. The motor 52 drives the wavelength conversion element 1F to rotate the phosphor layer 61 in the plane orthogonal to the radiation direction of the excitation light EL emitted from the light source section 110. This temporally changes (moves) the irradiated position of the wavelength conversion element 1F with the excitation light EL in the plane orthogonal to the radiation direction of the excitation light at speed corresponding to the rotation speed.

The phosphor wheel as described above increases the cooling efficiency of phosphors by encapsulating a refrigerant in a sealed housing along with the phosphors. The sealed housing is provided on the rotation substrate. The phosphor wheel may have the refrigerant adhere to a glass surface disposed on the heat dissipation member 23 side, for example, in FIG. 12 to decrease the transmittance of the glass surface. In addition, in a case where there is provided a reflecting member on the heat dissipation member 23 side, an adhering refrigerant may decrease the reflectance. In addition, this phosphor wheel cools vapor mainly by rotation in consideration of centrifugal force. This decreases the area effective for cooling the vapor and makes it difficult to obtain sufficient cooling efficiency. Further, there is provided space for vapor passage between the light emitting section and a reflecting plate. This may decrease the extraction efficiency of fluorescent light emitted from the phosphor layer.

In contrast, in the present modification example, the vaporized refrigerant 13 is liquidized on the inner wall surface of the storage section 21. This reduces droplets adhering to the cover glass 22 and improves the decreasing transmittance of the cover glass 22.

4-4. Modification Example 4

Figure 14:
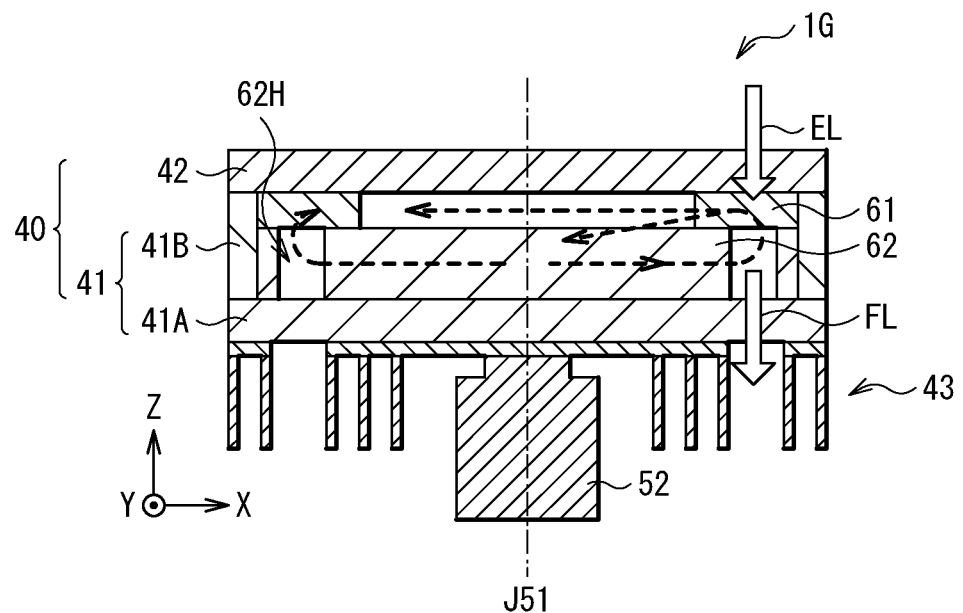
FIG. 14 is a cross-sectional schematic diagram illustrating an example of a configuration of a wavelength conversion element according to a modification example 4 of the present disclosure.

FIG. 14 schematically illustrates an example of a cross-sectional configuration of a wavelength conversion element (wavelength conversion element 1G) according to a modification example 4 of the present disclosure. As with the above-described first embodiment or the like, this wavelength conversion element 1G is an example of the wavelength conversion element 1 included in the light source module (light source module 100) of the projection display device (projector 1000). The wavelength conversion element 1G according to the present modification example is a so-called transmissive phosphor wheel that is rotatable around a rotation axis (e.g., axis J51).

In the present modification example, a refrigerant transport member 62 is provided with an opening 62H in the region corresponding to the irradiated position of the phosphor layer 61 with the excitation light EL as with the refrigerant transport member 12 according to the above-described modification example 1. In addition, the housing 40 in which the phosphor layer 61 and the refrigerant transport member 62 are encapsulated has a configuration similar to that of the above-described modification example 1. The rear cover 41A includes a material having light transmissivity. It is to be noted that the cooled section that abuts the opening 62H, in other words, the surface of the rear cover 41A that is in contact with the opening 62H is preferably subjected to water repellent treatment or hydrophilic treatment to have water repellency or hydrophilicity. This makes it possible to suppress a decrease in the transmittance for the fluorescent light FL passing through the opening 62H.

As described above, the present technology is also applicable to a rotary wavelength conversion element and makes it possible to increase the cooling efficiency and the light extraction efficiency.

4-5. Modification Example 5

Figure 15:
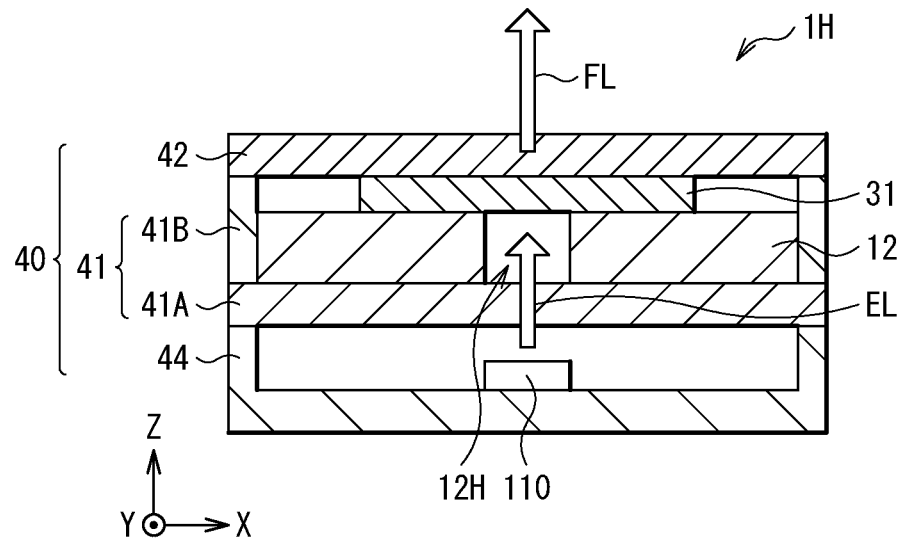
FIG. 15 is a cross-sectional schematic diagram illustrating an example of a configuration of a wavelength conversion element according to a modification example 5 of the present disclosure.

FIG. 15 schematically illustrates an example of a cross-sectional configuration of a wavelength conversion element (wavelength conversion element 1H) according to a modification example 5 of the present disclosure. As with the above-described first embodiment or the like, this wavelength conversion element 1H is an example of the wavelength conversion element 1 included in the light source module (light source module 100) of the projection display device (projector 1000). The wavelength conversion element 1H according to the present modification example is a so-called transmissive wavelength conversion element, for example, as with the wavelength conversion element 1D described in the above-described modification example 1 and is provided with a storage section 44 on the back surface (specifically, the back surface of the rear cover 41A) of the housing 40. The light source section 110 is stored in the storage section 44. That is, the wavelength conversion element 1H is integrated with the light source section 110.

As described above, in the present modification example, the back surface of the rear cover 41A is provided with the storage section 44 in which the light source section 110 is stored. The light source section 110 is a solid-state light emitting element that emits light having a predetermined wavelength. A semiconductor laser element is used that oscillates the excitation light EL (e.g., blue laser light having a wavelength of 445 nm or 455 nm). For example, aluminum, copper, stainless steel, low-carbon steel, an alloy material thereof, and the like are used for the storage section 44 as with the above-described storage section 21. Although not illustrated, it is preferable to dispose a condensing lens between the light source section 110 and the rear cover 41A (e.g., back surface of the rear cover 41A). The condensing lens condenses the excitation light EL in a predetermined spot diameter and outputs the excitation light EL toward the phosphor layer 31.

As described above, in the present modification example, the back surface of the rear cover 41A is provided with the storage section 44 in which the light source section 110 is stored and the storage section 44 is integrated with the light source section 110. This attains an effect of allowing the number of lenses included in the condensing optical system 114 to be decreased as compared with the independently disposed light source section 110, for example, as with the light source module 100A illustrated in FIG. 4 in addition to the effect of the above-described second embodiment.

4-6. Modification Example 6

Figure 16:
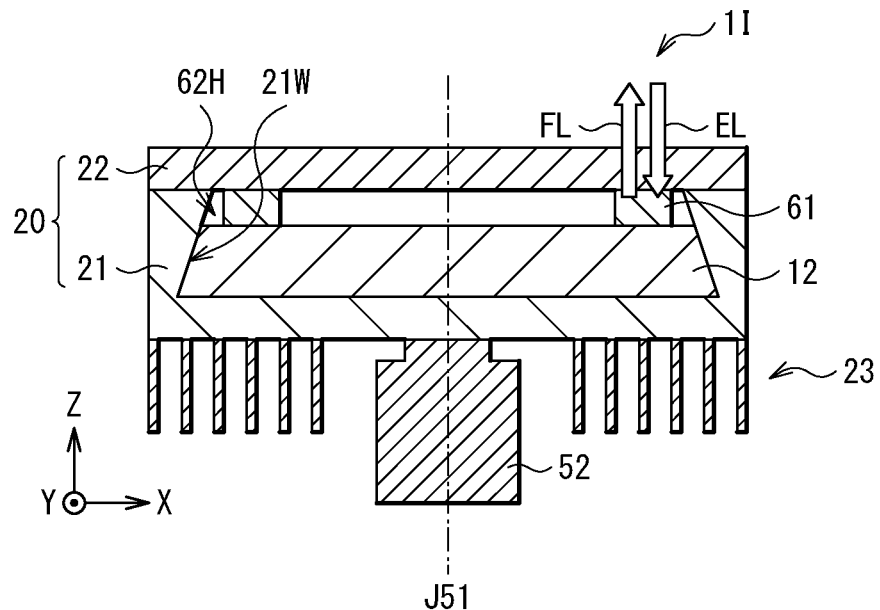
FIG. 16 is a cross-sectional schematic diagram illustrating an example of a configuration of a wavelength conversion element according to a modification example 6 of the present disclosure.

FIG. 16 schematically illustrates an example of a cross-sectional configuration of a wavelength conversion element (wavelength conversion element 1I) according to a modification example 6 of the present disclosure. As with the above-described first embodiment or the like, this wavelength conversion element 1I is an example of the wavelength conversion element 1 included in the light source module (light source module 100) of the projection display device (projector 1000). The wavelength conversion element 1I according to the present modification example is a so-called reflective phosphor wheel that is rotatable around the rotation axis (e.g., axis J51), for example, described in the above-described modification example 3 and is different from the above-described modification example 3 in that a side wall 21W of the storage section 21 is sloped. In addition, there is provided space (space 62S) between the outer periphery of the phosphor layer 61 and the side wall 21W of the storage section 21.

As described above, in the present modification example, the side wall 21W of the storage section 21 is sloped. This makes it possible to control the moving direction of a refrigerant encapsulated in the housing 20 by using rotary centrifugal force. In addition, in the present modification example, the space 62S is provided between the outer periphery of the phosphor layer 61 and the side wall 21W. This causes the refrigerant (vapor) vaporized in the phosphor layer 61 to flow at higher speed. It is thus possible to efficiently move the refrigerant to the refrigerant transport member 12 side and further increase the cooling efficiency and the light extraction efficiency.

Figure 17:
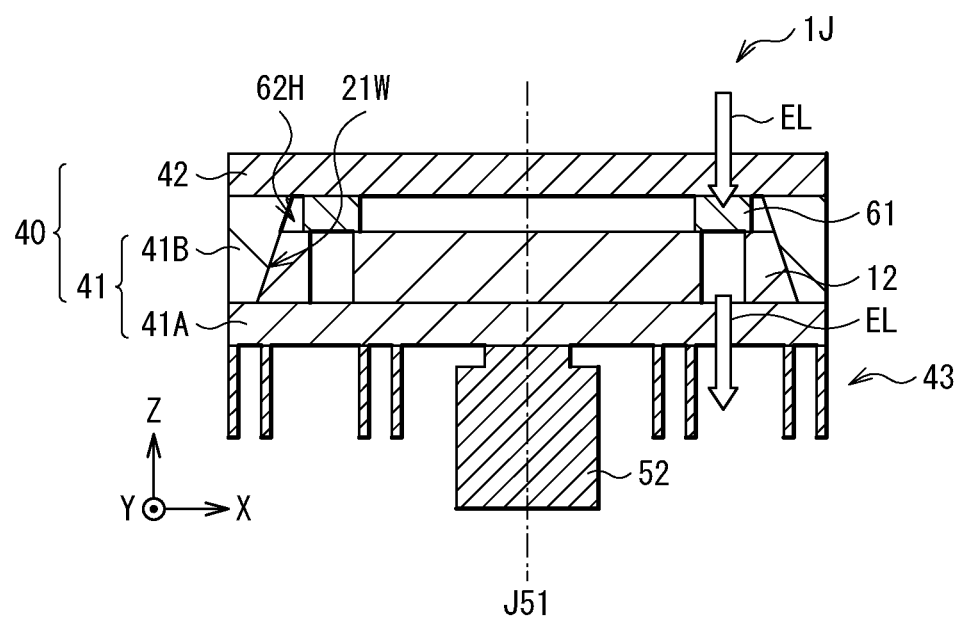
FIG. 17 is a cross-sectional schematic diagram illustrating another example of the configuration of the wavelength conversion element according to the modification example 6 of the present disclosure.

It is to be noted that the configuration of the present modification example is also applicable to a so-called transmissive phosphor wheel, for example, as with a wavelength conversion element 1J illustrated in FIG. 17. As with the reflective phosphor wheel (wavelength conversion element 1I), it is possible to further increase the cooling efficiency and the light extraction efficiency.

4-7. Modification Example 7

Figure 18:
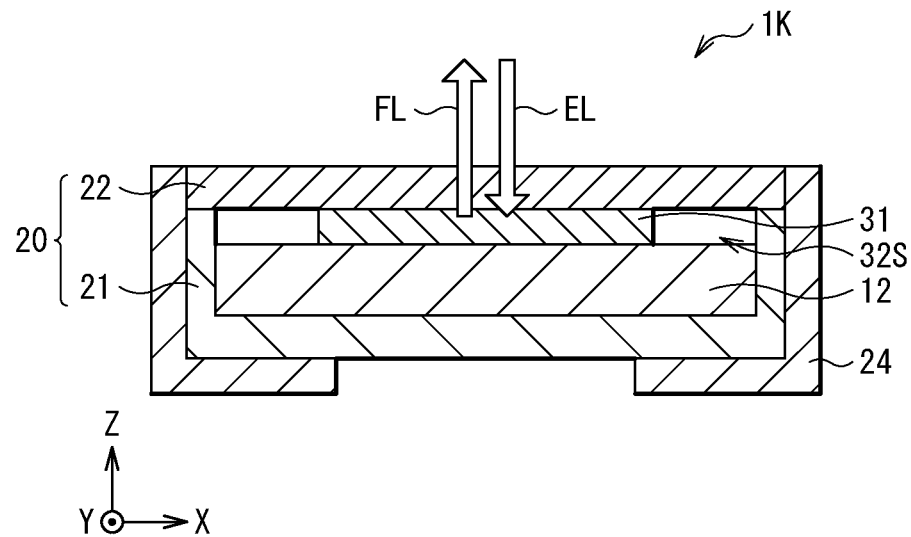
FIG. 18 is a cross-sectional schematic diagram illustrating an example of a configuration of a wavelength conversion element according to a modification example 7 of the present disclosure.

FIG. 18 schematically illustrates an example of a cross-sectional configuration of a wavelength conversion element (wavelength conversion element 1K) according to a modification example 7 of the present disclosure. As with the above-described first embodiment or the like, this wavelength conversion element 1K is an example of the wavelength conversion element 1 included in the light source module (light source module 100) of the projection display device (projector 1000). The wavelength conversion element 1K according to the present modification example is different from the above-described first embodiment in that the outer side wall and the back surface of the housing 20 are covered with a cooling member 24.

As described above, in the present modification example, the outer side wall and the back surface of the housing 20 are covered with the cooling member 24. The cooling member 24 includes, for example, a metal such as copper (Cu), aluminum (Al), molybdenum (Mo), or tungsten (W) or an alloy including the above-described metal. In addition, the cooling member 24 includes ceramics such as silicon carbide (SiC) or aluminum nitride (AlN) or a metal-mixed material including the above-described ceramic material.

As described above, in the present modification example, the outer side wall and the back surface of the housing 20 are covered with the cooling member 24. This makes it possible to subject the refrigerant in the storage section 21 to a phase change from vapor to liquid as in a case where the heat dissipation member 23 is provided as with the above-described first embodiment or the like.

5. Fourth Embodiment

In the above-described first to third embodiments and modification examples 1 to 7, the wavelength conversion element 1 (wavelength conversion elements 1A to 1K) is described that encapsulates the phosphor layer 11 and the refrigerant transport member 12, for example, in the housing 20. The phosphor layer 11 is formed as open-cell porous layer. It is, however, preferable that the phosphor layer 11 be in contact with or be joined to at least the cover glass 22. The following describes the respective configurations of wavelength conversion elements 1L to 1N according to the present embodiment.

5-1. Configuration of Reflective Wavelength Conversion Element

Figure 19:
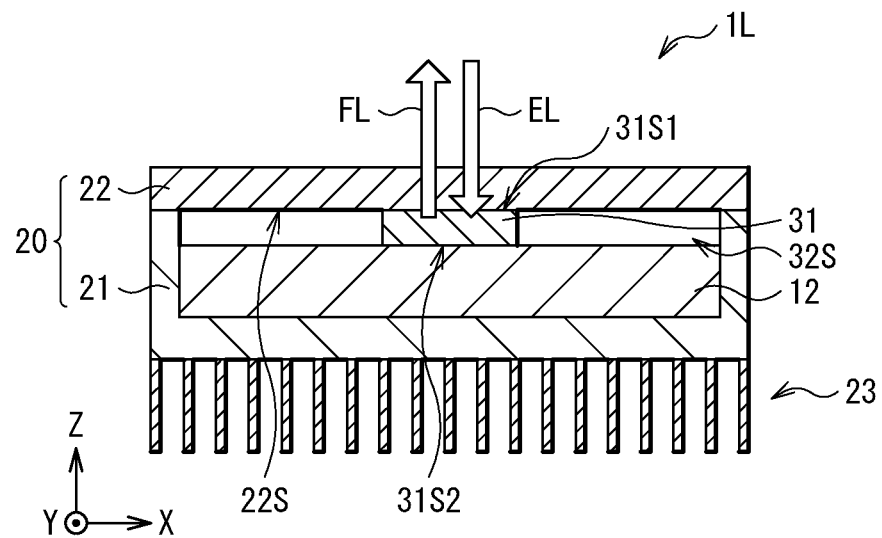
FIG. 19 is a cross-sectional schematic diagram illustrating an example of a configuration of a wavelength conversion element according to a fourth embodiment of the present disclosure.

FIG. 19 schematically illustrates an example of a cross-sectional configuration of a wavelength conversion element (wavelength conversion element 1L) according to a fourth embodiment of the present disclosure. As with the above-described first embodiment or the like, this wavelength conversion element 1L is an example of the wavelength conversion element 1 included in the light source module (light source module 100) of the projection display device (projector 1000). The wavelength conversion element 1L is a so-called reflective wavelength conversion element as with the above-described wavelength conversion elements 1A to 1C and the like.

Figure 20:
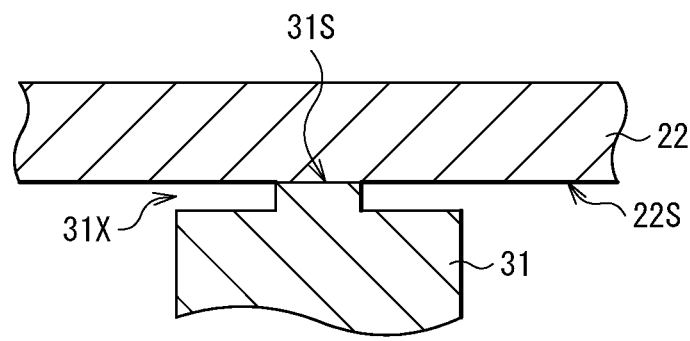
FIG. 20 is a schematic diagram illustrating another example of a configuration of a main portion of the wavelength conversion element illustrated in FIG. 19.

The phosphor layer 31 of the wavelength conversion element 1L has a smaller diameter than that of the refrigerant transport member 12 as with the wavelength conversion element 1B according to the above-described second embodiment. The phosphor layer 31 of the wavelength conversion element 1L is provided with space (space 32S) between the side surface of the phosphor layer 31 and the side wall of the housing 20. In addition, the phosphor layer 31 has a pair of opposed surfaces (surface 31S1 (first surface) and surface 31S2 (second surface)). The surface 31S1 faces the cover glass 22 and the surface 31S2 faces the refrigerant transport member 12. In the present embodiment, the surface 31S1 is a flat surface or a portion of the surface 31S1 has a protruding section 31X as illustrated in FIG. 20. The entire surface 31S1 of the phosphor layer 31 or at least a portion (protruding section 3X) of the surface 31S1 of the phosphor layer 31 is in contact with or is joined to a surface 22S of the cover glass 22. It is to be noted that the wording "contact" means that a plurality of phosphor particles included in the phosphor layer 31 described below and the cover glass 22 are in contact with each other. The wording "join" means that at least a portion of the molecules on the surface of the phosphor particles and at least a portion of the molecules on the surface of the cover glass are linked and integrated with each other with a molecular bond such as a covalent bond, an ionic bond, or a metallic bond or the phosphor particles and the cover glass are bonded and integrated with each other with a binder material such as a glass material or a resin material.

Figure 21A:
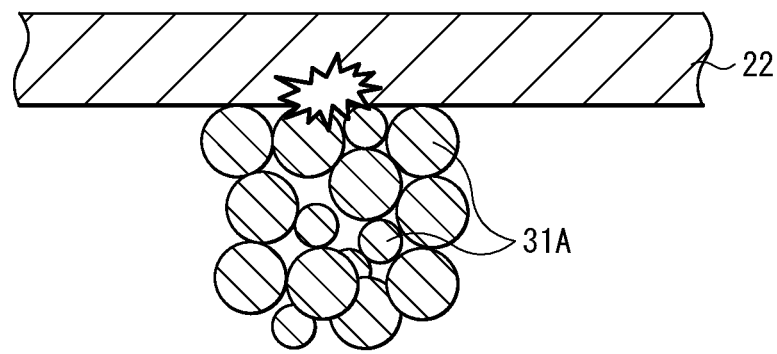
FIG. 21A is an enlarged schematic diagram illustrating the configuration of the main portion of the wavelength conversion element illustrated in FIG. 19.
Figure 21B:
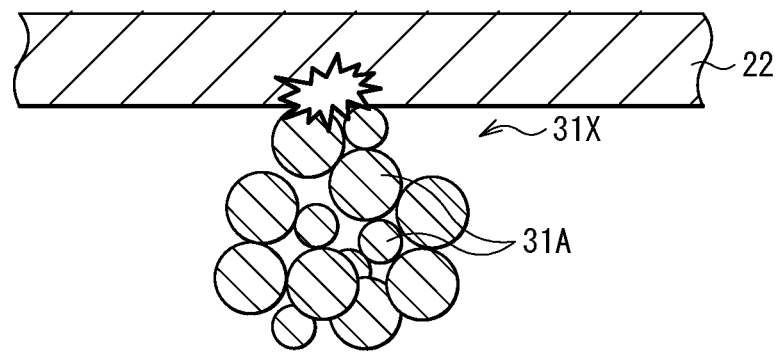
FIG. 21B is an enlarged schematic diagram illustrating the configuration of the main portion of the wavelength conversion element illustrated in FIG. 20.

FIG. 21A is an enlarged view of a contact portion at which the entire surface 31S1 of the phosphor layer 31 is in contact with the surface 22S of the cover glass 22. FIG. 21B is an enlarged view of a contact portion at which the protruding section 31X on the surface 31S1 of the phosphor layer 31 is in contact with the surface 22S of the cover glass 22. The phosphor layer 31 includes a plurality of phosphor particles (phosphor particles 31A). It is preferable that the plurality of these phosphor particles 31A be in contact with or be joined to the surface 22S of the cover glass 22. In addition, in a case where the protruding section 31X formed on the surface 31S1 of the phosphor layer 31 is in contact with or is joined to the surface 22S of the cover glass 22 as illustrated in FIG. 21B, it is preferable that the protruding section 31X match the light emitting region of the phosphor layer 31 or the irradiated position (light emitting section) with the excitation light EL. This prevents a droplet from adhering to the surface 22S of the cover glass 22 and makes it possible to prevent the droplet from causing light scattering.

Figure 22:
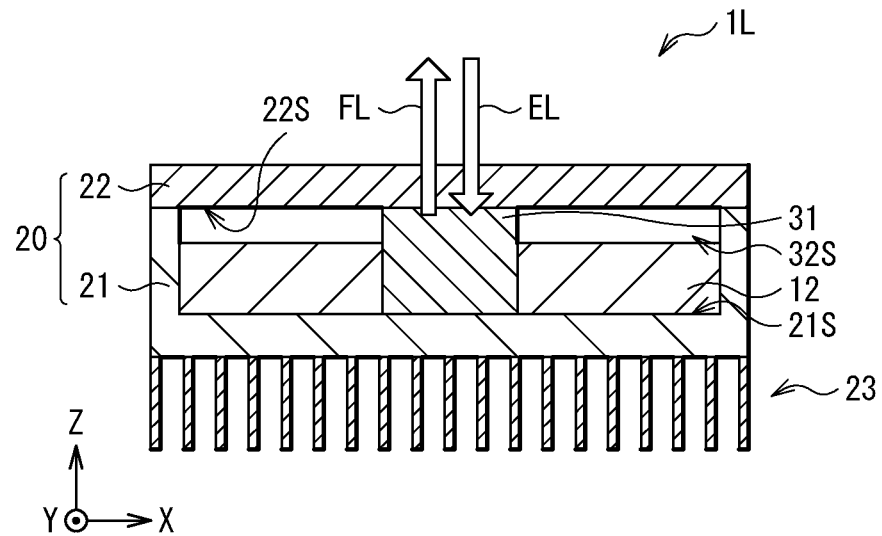
FIG. 22 is a cross-sectional schematic diagram illustrating another example of a configuration of the wavelength conversion element illustrated in FIG. 19.
Figure 23:
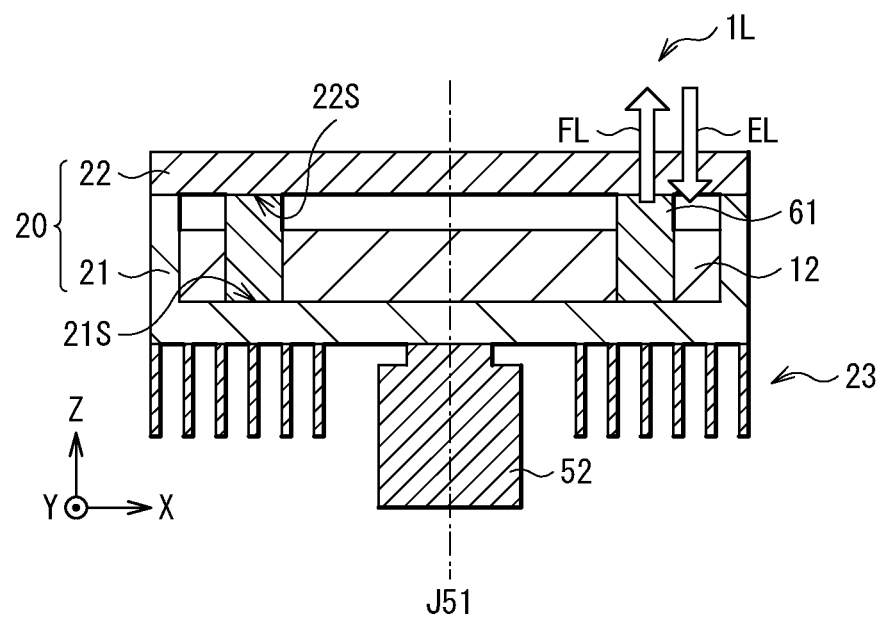
FIG. 23 is a cross-sectional schematic diagram illustrating another example of the configuration of the wavelength conversion element illustrated in FIG. 19.

In addition, FIG. 19 illustrates the example in which the surface 31S1 of the phosphor layer 31 and the surface 22S of the cover glass 22 are in contact with or are joined to each other and the surface 31S2 of the phosphor layer 31 faces the refrigerant transport member 12, but this is not limitative. For example, as illustrated in FIG. 22, the surface 31S2 of the phosphor layer 31 and the bottom surface (surface 21S; another surface) of the storage section 21 may be further in contact with or be joined to each other. Further, the wavelength conversion element 1L according to the present embodiment is also applicable to a so-called reflective phosphor wheel that is rotatable around a rotation axis (e.g., axis J51) as illustrated in FIG. 23.

5-2. Configuration of Transmissive Wavelength Conversion Element

Figure 24:
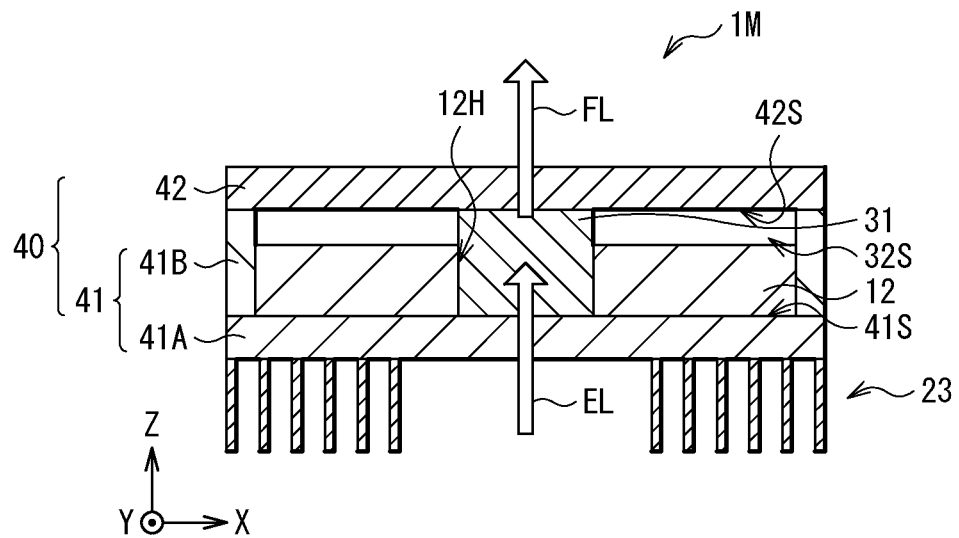
FIG. 24 is a cross-sectional schematic diagram illustrating another example of the configuration of the wavelength conversion element according to the fourth embodiment of the present disclosure.

FIG. 24 schematically illustrates an example of a cross-sectional configuration of a wavelength conversion element (wavelength conversion element 1M) according to a fourth embodiment of the present disclosure. As with the above-described first embodiment or the like, this wavelength conversion element 1M is an example of the wavelength conversion element 1 included in the light source module (light source module 100) of the projection display device (projector 1000). The wavelength conversion element 1M is a so-called transmissive wavelength conversion element as with the above-described wavelength conversion elements 1D, 1E, and the like.

The phosphor layer 31 of the wavelength conversion element 1M has a smaller diameter than that of the refrigerant transport member 12 as with the wavelength conversion element 1D according to the above-described modification example 1. The phosphor layer 31 of the wavelength conversion element 1M is provided with space (space 32S) between the side surface of the phosphor layer 31 and the side wall of the housing 40. In addition, the refrigerant transport member 12 is provided with the opening 12H in the region corresponding to the irradiated position of the phosphor layer 31 with the excitation light EL. The surface 31S1 of the phosphor layer 31 is in contact with or is joined to a surface 42S of the cover glass 42 and the surface 31S2 of the phosphor layer 31 is also in contact with or is joined to the bottom surface (surface 41S) of the storage section 41 (specifically, the rear cover 41A). In other words, for example, the surface 31S1 of the phosphor layer 31 is in contact with or is joined to the surface 42S of the cover glass 42 and the surface 31S2 of the phosphor layer 31 is in contact with or is joined to the surface 41S of the rear cover 41A via the opening 12H provided in the region corresponding to the irradiated position of the phosphor layer 31 with the excitation light EL.

It is to be noted that FIG. 24 illustrates the example in which the excitation light EL is inputted from the rear cover 41A side and the fluorescent light FL is outputted from the cover glass 42 side, but this is not limitative. For example, the excitation light EL may be inputted from the cover glass 42 side and the fluorescent light FL may be outputted from the rear cover 41A side.

Figure 25:
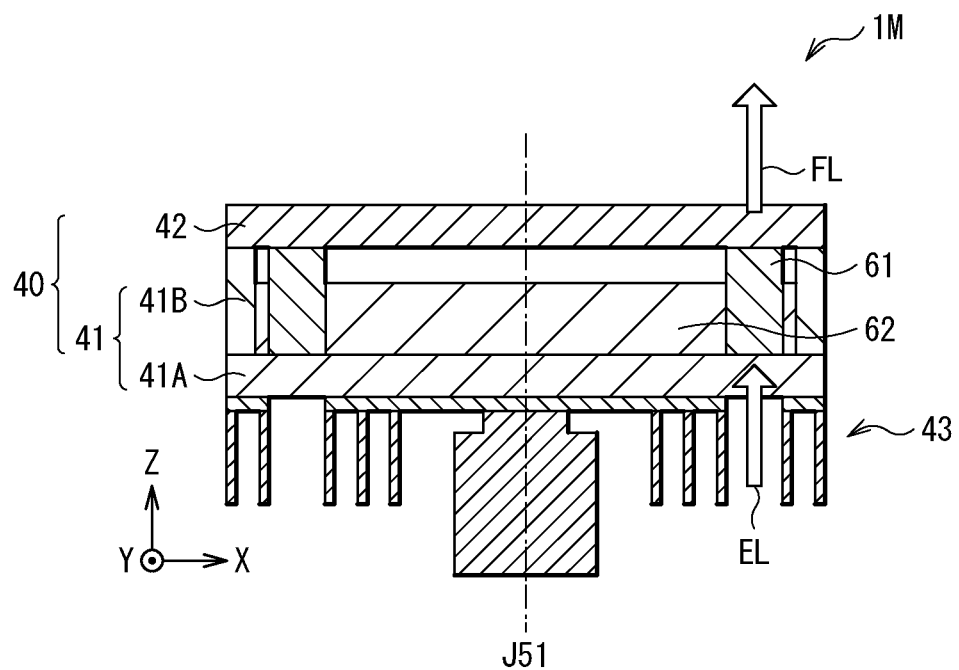
FIG. 25 is a cross-sectional schematic diagram illustrating another example of the configuration of the wavelength conversion element illustrated in FIG. 24.
Figure 26:
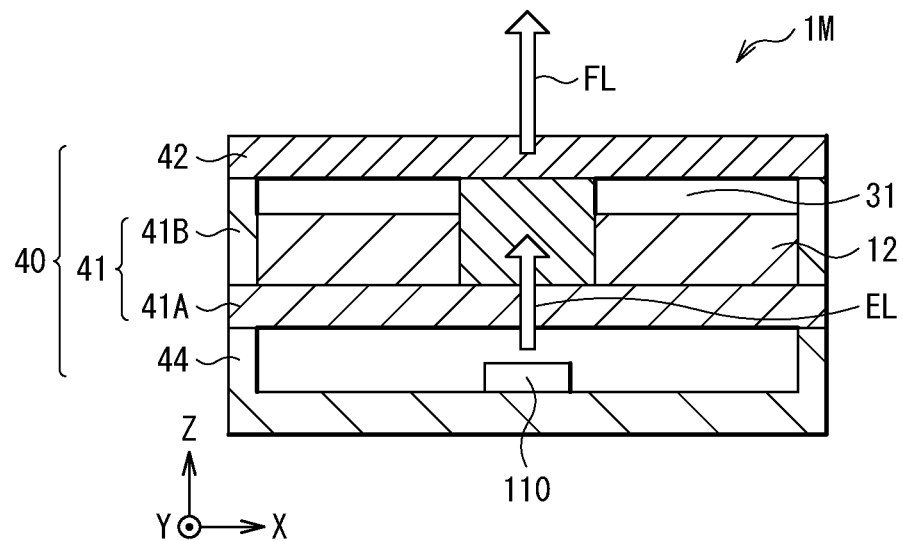
FIG. 26 is a cross-sectional schematic diagram illustrating another example of the configuration of the wavelength conversion element illustrated in FIG. 24.

In addition, the wavelength conversion element 1M according to the present embodiment is also applicable to a so-called transmissive phosphor wheel that is rotatable around a rotation axis (e.g., axis J51) as illustrated in FIG. 25. Further, the wavelength conversion element 1M according to the present embodiment may have a configuration in which the storage section 44 is provided on the back surface of the rear cover 41A as illustrated in FIG. 26. The light source section 110 is stored in the storage section 44.

5-3. Other Configurations

Further, the wavelength conversion element 1 (e.g., wavelength conversion element 1A) including a refrigerant transport member (e.g., refrigerant transport member 12) has been described in the above-described first embodiment or the like. The refrigerant transport member (e.g., refrigerant transport member 12) includes a sintered ceramic compact, a sintered metal, or a porous metal. The refrigerant transport member may, however, include, for example, the following materials.

Figure 27:
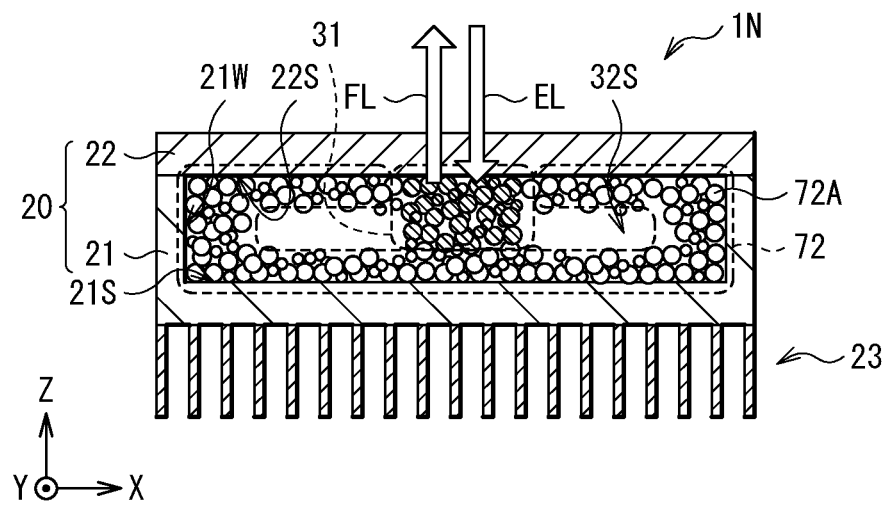
FIG. 27 is a cross-sectional schematic diagram illustrating another example of the configuration of the wavelength conversion element according to the fourth embodiment of the present disclosure.

FIG. 27 schematically illustrates an example of a cross-sectional configuration of a wavelength conversion element (wavelength conversion element 1N) according to a fourth embodiment of the present disclosure. This wavelength conversion element 1N is a reflective wavelength conversion element that includes, for example, a plurality of particles 72A each having light reflectivity in a refrigerant transport member 72. Examples of the particles 72A each having light reflectivity include metals or the like such as barium sulfate ($BaSO_4$), titanium oxide ($TiO_2$), alumina ($Al_2O_3$), glass-coated aluminum, and the like. The refrigerant transport member 72 according to the present embodiment locally includes the plurality of particles 72A in contact with the inner wall of the housing 20. Specifically, the refrigerant transport member 72 according to the present embodiment locally includes the plurality of particles 72A in contact with the surface 21S and the side wall 21W of the storage section 21 and the surface 22S of the cover glass 22. The refrigerant transport member 72 according to the present embodiment is provided with the space 32S in the middle of the housing 20. The refrigerant 13 is circulated to the phosphor layer 31 via a gap in the refrigerant transport member 72 provided along the inner wall of the housing 20. The refrigerant 13 vaporized in the phosphor layer 31 is discharged to the space 32S formed in the middle of the housing 20.

It is to be noted that the wavelength conversion element 1N according to the present embodiment includes particles each having light transmissivity in the refrigerant transport member 72. This makes it possible to configure a transmissive wavelength conversion element. Examples of the particles each having light transmissivity include a $SiO_2$-based glass, alumina ($Al_2O_3$), and the like. In a case where the refrigerant transport member 72 includes particles each having light transmissivity, particles included in the refrigerant transport member 72 may be in contact with the surface 42S of the cover glass 42 and the surface 41S of the rear cover 41A instead of phosphor particles 32A included in the phosphor layer 31.

Figure 28:
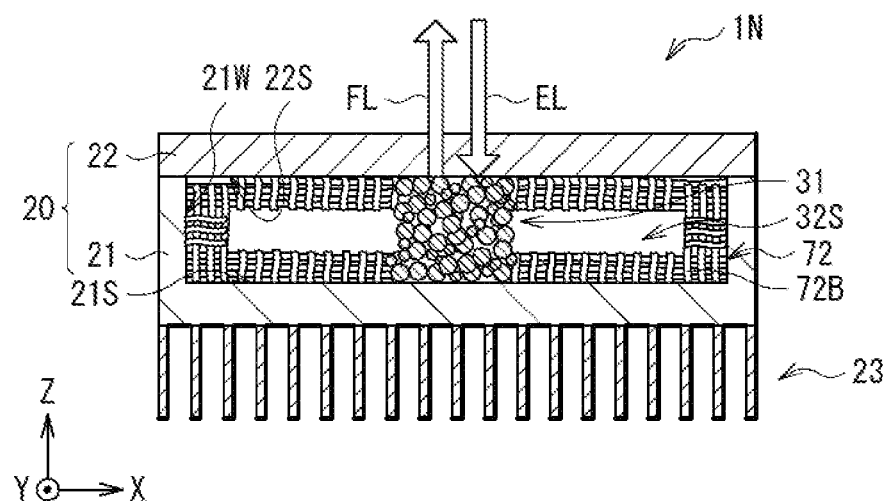
FIG. 28 is a cross-sectional schematic diagram illustrating another example of the configuration of the wavelength conversion element illustrated in FIG. 27.

In addition, the refrigerant transport member 72 may include a fibrous structure 72B in addition to the plurality of particles 72A. FIG. 28 schematically illustrates a cross-sectional configuration of the wavelength conversion element 1N including the refrigerant transport member 72 including the fibrous structure 72B. Examples of a material of the fibrous structure 72B include a metal such as stainless steel, a resin, a glass, ceramics, or the like.

5-4. Workings and Effects

In the above-described first to third embodiments and modification examples 1 to 7, the wavelength conversion element 1 (e.g., wavelength conversion element 1A) has been described that, for example, encapsulates the stacked phosphor layer 11 and refrigerant transport member 12 in the housing 20 along with the refrigerant 13 and circulates the refrigerant 13 between the phosphor layer 11 and the refrigerant transport member 12 to directly cool the phosphor layer 11 with the refrigerant 13. The phosphor layer 11 and the refrigerant transport member 12 each have a gap therein. However, in the above-described wavelength conversion element 1, the refrigerant 13 that is vaporized by taking away heat from the phosphor layer 11 is sometimes liquidized and adheres as a droplet upon coming into contact with the cover glass 22. This droplet acts as a scatterer when the excitation light EL and the fluorescent light FL pass through the cover glass 22 and may decrease the use efficiency of the excitation light EL and the fluorescent light FL.

In contrast, in the wavelength conversion elements 1L to 1N according to the present embodiment, at least a portion of the surface 31S1 of the phosphor layer 31 and the surface 21S of the cover glass 22 (or the surface 42S of the cover glass 42) are at least in contact with or are joined to each other. This prevents droplets from adhering to the optical paths of the excitation light EL and the fluorescent light FL.

Figure 29:
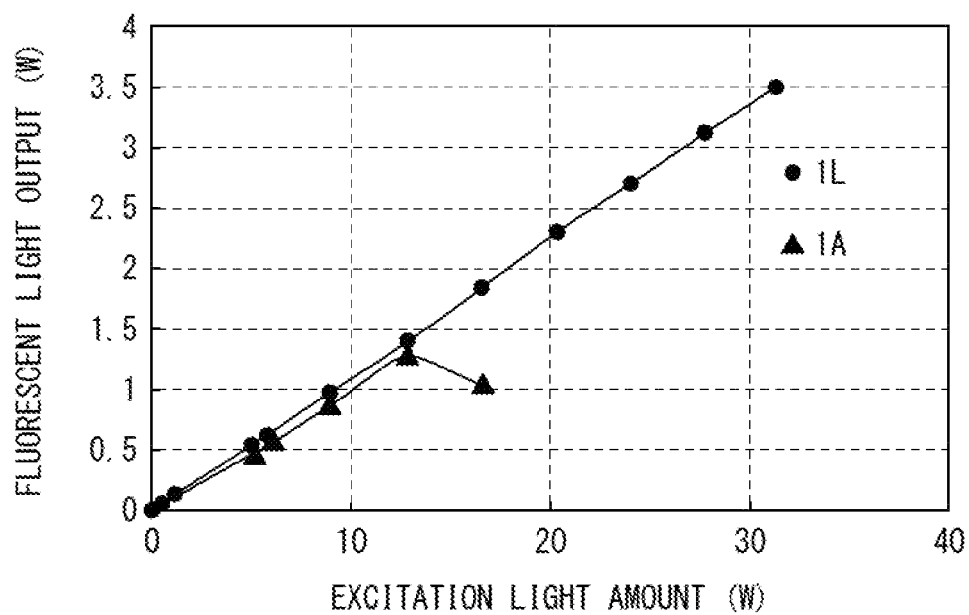
FIG. 29 is a characteristic diagram illustrating a relationship between an excitation light amount and a fluorescent light output of a wavelength conversion element according to the present disclosure.

FIG. 29 is a characteristic diagram illustrating, for example, the relationship between an excitation light amount (W) and a fluorescent light output (W) of the wavelength conversion element 1L. As a comparative example, the relationship is also illustrated between the excitation light amount and the fluorescent light output of the wavelength conversion element 1A according to the above-described first embodiment. As illustrated in FIG. 29, in the wavelength conversion element 1L in which the surface 31S1 of the phosphor layer 31 and the surface 22S of the cover glass 22 are in contact with or are joined to each other does not have a decrease in the fluorescent light output (W) with the certain excitation light amount (W) as compared with the wavelength conversion element 1A in which the surface 31S1 of the phosphor layer 31 and the surface 22S of the cover glass 22 are not necessarily in contact with each other. That is, in the wavelength conversion elements 1L to 1N according to the present embodiment, it is possible to prevent a decrease in the light use efficiency.

In addition, in the wavelength conversion element 1N according to the present embodiment, the refrigerant transport member 72 includes the plurality of particles 72A and the fibrous structure 72B each having light reflectivity or light transmissivity. Further, the refrigerant transport member 72 is provided along the inner wall of the housing 20. This makes it possible to reduce a performance difference caused by an attitude such as an angle in addition to the above-described effect.

6. Modification Example

Another Configuration Example 1 of Light Source Module

Figure 30:
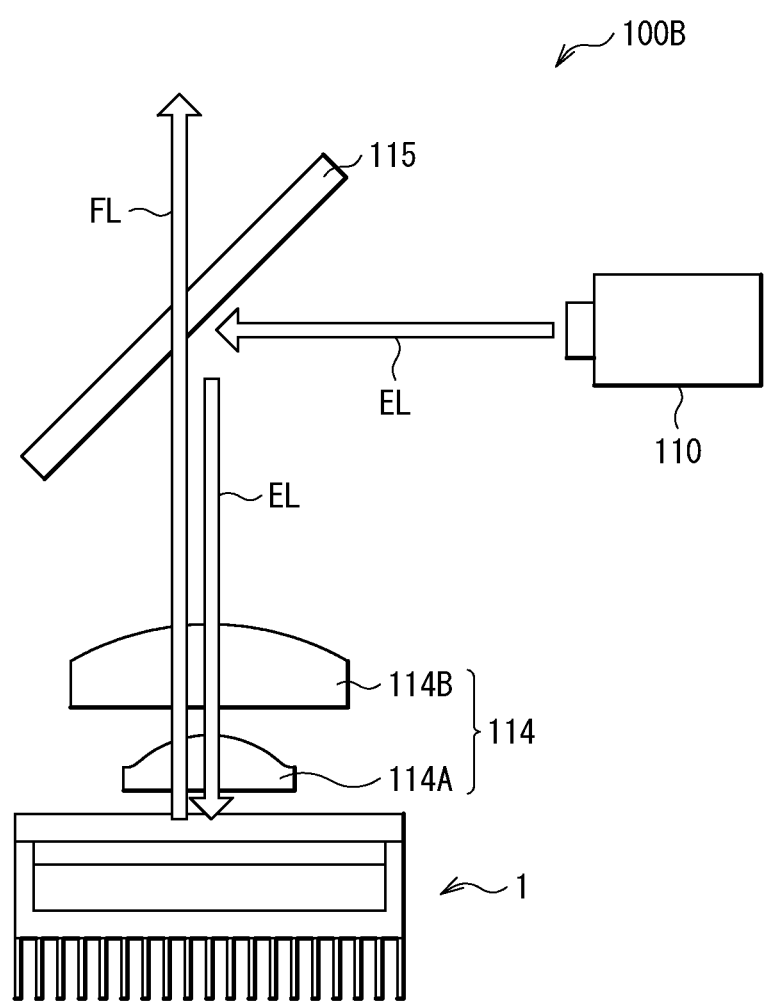
Figure 31:
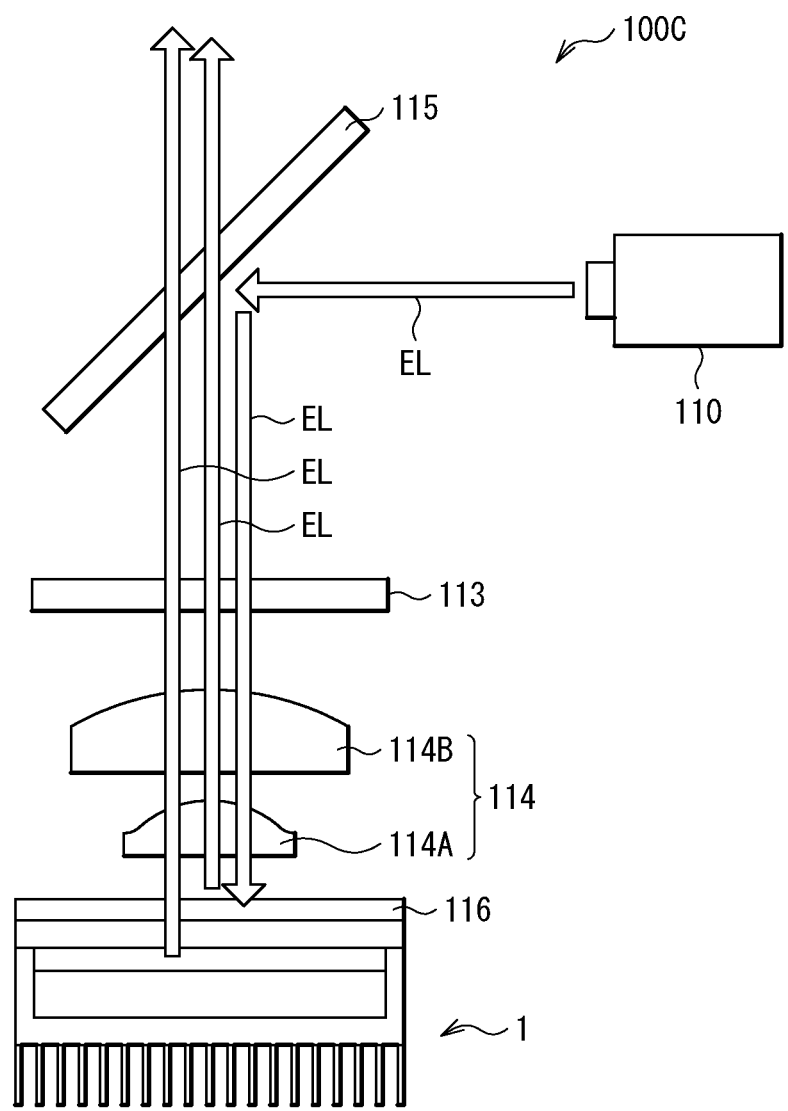

FIG. 30 is an outline diagram illustrating another example (light source module 100B) of the light source module 100A described in the above-described first embodiment. The light source module 100B is, for example, used as the light source module 100 of the projector 1000 illustrated in FIG. 5.

The light source module 100B includes the wavelength conversion element 1, the light source section 110, a dichroic mirror 115, and the condensing optical system 114. The respective members included in the above-described light source module 100C are disposed on an optical path of light (combined light Lw) emitted from the wavelength conversion element 1 in the order of the condensing optical system 114, the quarter-wave plate 113, and the PBS 112 from the wavelength conversion element 1 side. The light source section 110 is disposed at a position in the direction orthogonal to the optical path of the combined light Lw at which the excitation light EL is reflected by the dichroic mirror 115 toward the wavelength conversion element 1.

Another Configuration Example 2 of Light Source Module

FIG. 30 is an outline diagram illustrating another example (light source module 100C) of the light source module 100A described in the above-described first embodiment. The light source module 100C is, for example, used as the light source module 100 of the projector 1000 illustrated in FIG. 5.

The light source module 100C includes the wavelength conversion element 1, the light source section 110, the dichroic mirror 115, the quarter-wave plate 113, and the condensing optical system 114. The respective members included in the above-described light source module 100C are disposed on an optical path of light (combined light Lw) emitted from the wavelength conversion element 1 in the order of the condensing optical system 114, the quarter-wave plate 113, and the dichroic mirror 115 from the wavelength conversion element 1 side. A dichroic mirror 116 is further disposed on the front surface (e.g., on the cover glass 22) of the wavelength conversion element 1. This reflects a portion of the excitation light EL (blue light). The reflected excitation light EL (blue light) is combined with the fluorescent light FL (yellow light) to generate white light.

Another Configuration Example 3 of Light Source Module

Figure 32:
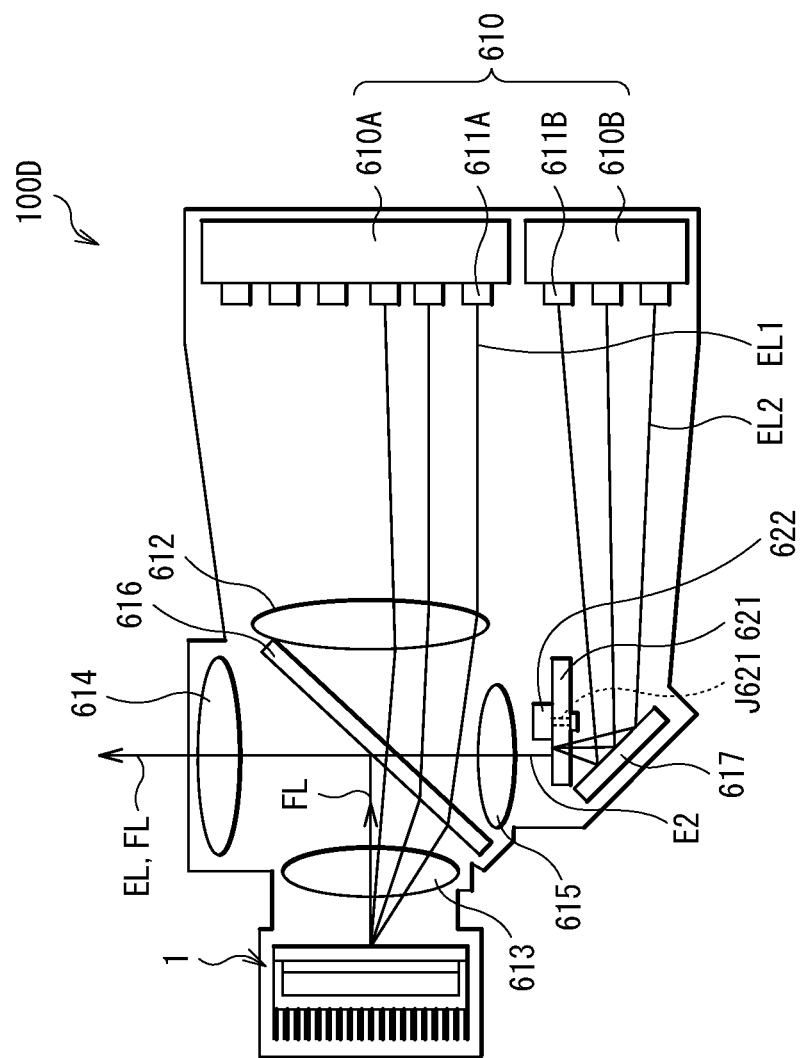

FIG. 32 is an outline diagram illustrating another example (light source module 100D) of the light source module 100A described in the above-described first embodiment. The light source module 100D is, for example, used as the light source module 100 of the projector 1000 illustrated in FIG. 5.

The light source module 100D includes the above-described wavelength conversion element 1 (e.g., wavelength conversion element 1A), a diffusing plate 621, a light source section 610 that emits excitation light or laser light, lenses 612 to 615, a dichroic mirror 616, and a reflecting mirror 617. The diffusing plate 621 is rotatably supported by a shaft J621. The light source section 610 includes a first laser group 610A and a second laser group 610B. The first laser group 610A has a plurality of semiconductor laser elements 611A arranged therein. The plurality of semiconductor laser elements 611A each oscillates excitation light (e.g., wavelength of 445 nm or 455 nm). The second laser group 610B has a plurality of semiconductor laser elements 611B arranged therein. The plurality of semiconductor laser elements 611B each oscillates blue laser light (e.g., wavelength of 465 nm). Here, for the purpose of convenience, EL1 represents excitation light oscillated by the first laser group 610A and EL2 represents blue laser light (referred to simply as blue light below) oscillated by the second laser group 610B.

In the light source module 100D, the wavelength conversion element 1 is disposed to input the excitation light EL1 to the phosphor layer 11. The excitation light EL1 has passed through the lens 612, the dichroic mirror 616, and the lens 613 in order from the first laser group 610A. The fluorescent light FL from the wavelength conversion element 1 is reflected by the dichroic mirror 616. Afterward, the fluorescent light FL passes through the lens 614 and travels to the outside, in other words, to the illumination optical system 200. The diffusing plate 621 diffuses the blue light EL2 that has passed through the reflecting mirror 617 from the second laser group 610B. The blue light EL2 diffused by the diffusing plate 621 passes through the lens 615 and the dichroic mirror 616. Afterward, the blue light EL2 passes through the lens 614 and travels to the outside, in other words, to the illumination optical system 200.

Another Configuration Example of Projector

Figure 33:
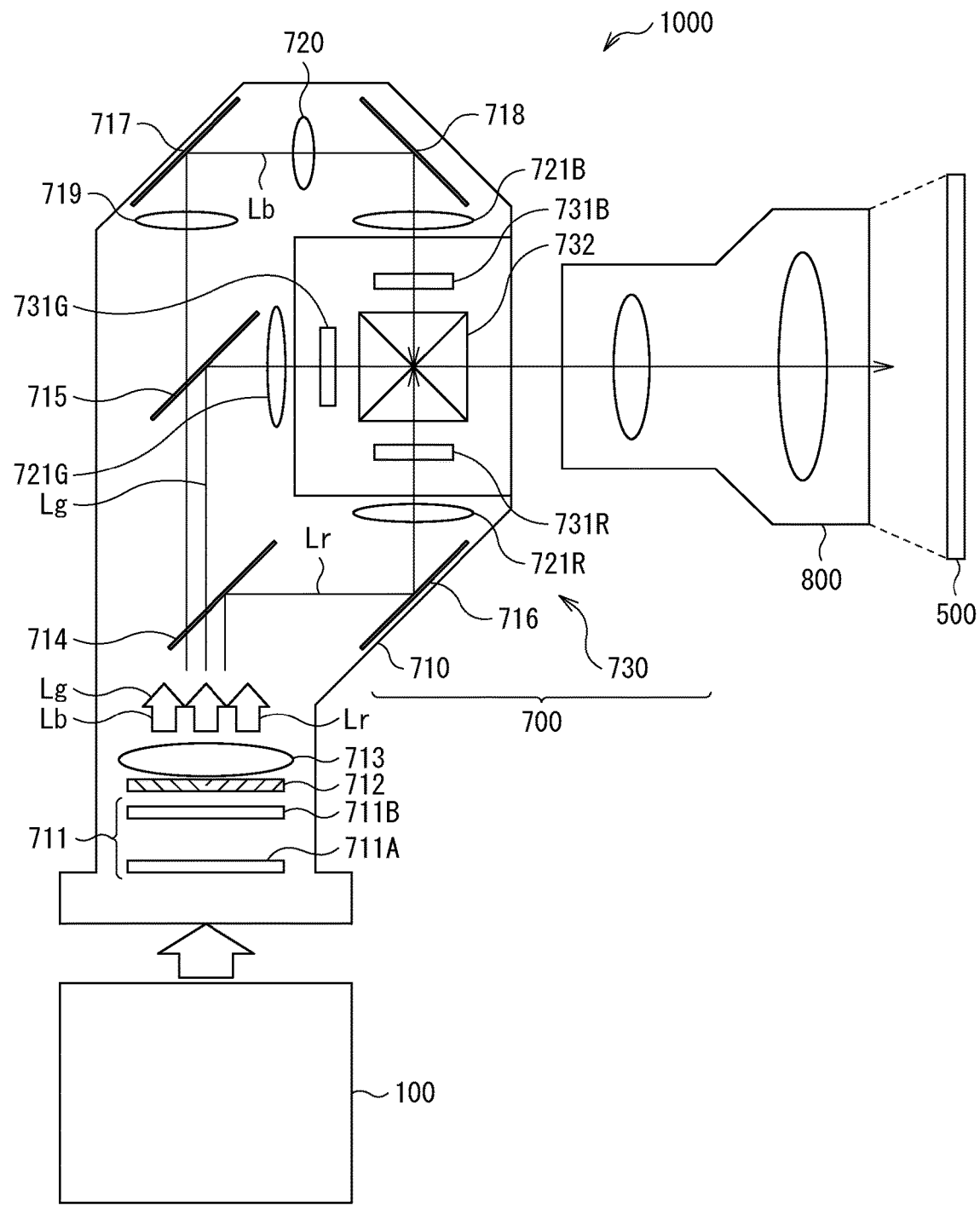

FIG. 33 is an outline diagram illustrating an example of a configuration of a transmissive 3LCD projection display device (projector 1000) that performs light modulation by using a transmissive liquid crystal panel. This projector 1000 includes, for example, the light source module 100, an image generation system 700 including an illumination optical system 710 and an image generation section 730, and a projection optical system 800.

The illumination optical system 710 includes, for example, an integrator element 711, a polarization conversion element 712, and a condensing lens 713. The integrator element 711 includes a first fly eye lens 711A and a second fly eye lens 711B. The first fly eye lens 711A includes a plurality of microlenses that is two-dimensionally arranged. The second fly eye lens 711B includes a plurality of microlenses that is arranged to correspond to the respective microlenses included in the first fly eye lens 711A.

Light (parallel light) inputted the integrator element 711 from the light source module 100 is divided into a plurality of light fluxes by the microlenses of the first fly eye lens 711A. Images of the light fluxes are formed on the respective corresponding microlenses of the second fly eye lens 711B. The respective microlenses of the second fly eye lens 711B function as secondary light sources. The polarization conversion element 712 is irradiated with the plurality of pieces of parallel light having uniform luminance as inputted light.

The integrator element 711 has a function of arranging the inputted light with which the polarization conversion element 712 is irradiated from the light source module 100 as light having uniform luminance distribution as a whole.

The polarization conversion element 712 has a function of making the pieces of inputted light have a uniform polarization state. The pieces of inputted light are inputted via the integrator element 711 or the like. For example, this polarization conversion element 712 outputs outputted light including blue light Lb, green light Lg, and red light Lr via a lens and the like disposed on the output side of the light source module 100.

The illumination optical system 710 further includes a dichroic mirror 714 and a dichroic mirror 715, a mirror 716, a mirror 717, and a mirror 718, a relay lens 719 and a relay lens 720, a field lens 721R, a field lens 721G, and a field lens 721B, liquid crystal panels 731R, 731G, and 731B serving as the image generation section 730, and a dichroic prism 732.

The dichroic mirror 714 and the dichroic mirror 715 each have a property of selectively reflecting colored light in a predetermined wavelength region and transmitting the pieces of light in the other wavelength regions. For example, the dichroic mirror 714 selectively reflects the red light Lr. The dichroic mirror 715 selectively reflects the green light Lg of the green light Lg and the blue light Lb that have passed through the dichroic mirror 714. The remaining blue light Lb passes through the dichroic mirror 715. This separates light (e.g., white combined light Lw) outputted from the light source module 100 into a plurality of pieces of colored light that is different in color.

The separated red light Lr is reflected by the mirror 716 and passes through the field lens 721R to be collimated. Afterward, the red light Lr is inputted to the liquid crystal panel 731R for modulation of red light. The green light Lg passes through the field lens 721G to be collimated. Afterward, the green light Lg is inputted to the liquid crystal panel 731G for modulation of green light. The blue light Lb passes through the relay lens 719 and is reflected by the mirror 717. The blue light Lb further passes through the relay lens 720 and is reflected by the mirror 718. The blue light Lb reflected by the mirror 718 passes through the field lens 721B to be collimated. Afterward, the blue light Lb is inputted to the liquid crystal panel 731B for modulation of the blue light Lb.

The liquid crystal panels 731R, 731G, and 731B are electrically coupled to an unillustrated signal source (e.g., PC or the like) that supplies image signals including image information. The liquid crystal panels 731R, 731G, and 731B modulate the pieces of inputted light for the respective pixels on the basis of the supplied image signals of the respective colors and respectively generate a red color image, a green color image, and a blue color image. The pieces of modulated light of the respective colors (formed images) are inputted to the dichroic prism 732 and are combined together. The dichroic prism 732 superposes and combines together the pieces of light of the respective colors that have been inputted from the three directions and outputs the light toward the projection optical system 800.

The projection optical system 800 includes, for example, a plurality of lenses and the like. The projection optical system 800 enlarges light outputted from the image generation system 700 and projects the light onto the screen 500.

Although the present disclosure has been described with reference to the first to fourth embodiments and the modification examples, the present disclosure is not limited to the above-described embodiments or the like. The present disclosure may be modified in a variety of ways. For example, the material, thickness, and the like of each layer that have been described in the above-described embodiments are merely examples, but not limited thereto. Another material and thickness may be adopted.

In addition, it is possible to combine the above-described first to fourth embodiments and modification examples 1 to 7 with each other.

Further, in the present technology, the wavelength conversion element 1 (wavelength conversion elements 1A to 1N), the light source module 100, and the like according to the present technology may be used for a device that is not the projection display device. For example, the light source module 100 according to the present disclosure may be used for illumination application and is applicable, for example, to a head lamp for an automobile and a light source for lighting up.

It is to be noted that the present technology may also have configurations as follows. According to the present technology having the following configurations, a phosphor layer, a refrigerant, and a refrigerant transport member are encapsulated in a housing, causing the refrigerant to efficiently cool the phosphor layer. The phosphor layer includes a plurality of phosphor particles and has a gap therein. The refrigerant cools the phosphor layer. The refrigerant transport member is provided in contact with the phosphor layer and circulates the refrigerant. This makes it possible to increase the heat dissipation characteristic of the wavelength conversion element. It is to be noted that the effects described here are not necessarily limited, but any of effects described in the present disclosure may be included.

(1)

A wavelength conversion element including:
a phosphor layer including a plurality of phosphor particles, the phosphor layer having a gap therein;
a refrigerant that cools the phosphor layer;
a refrigerant transport member provided in contact with the phosphor layer, the refrigerant transport member circulating the refrigerant; and
a housing in which the phosphor layer, the refrigerant, and the refrigerant transport member are encapsulated.

(2)

The wavelength conversion element according to (1), in which
the refrigerant is circulated by capillary force generated in the phosphor layer and the refrigerant transport member, and
the capillary force in the phosphor layer is greater than the capillary force in the refrigerant transport member.

(3)

The wavelength conversion element according to (1) or (2), in which the refrigerant transport member has light reflectivity.

(4)

The wavelength conversion element according to any of (1) to (3), in which the phosphor layer has space between the phosphor layer and a side wall of the housing.

(5)

The wavelength conversion element according to any of (1) to (4), in which the phosphor layer has an open-cell porous structure.

(6)

The wavelength conversion element according to any of (1) to (5), in which the phosphor layer includes a ceramic phosphor.

(7)

The wavelength conversion element according to any of (1) to (6), in which the refrigerant transport member has an open-cell porous structure.

(8)

The wavelength conversion element according to any of (1) to (7), in which the refrigerant transport member includes a sintered ceramic compact, a sintered metal, or a porous metal.

(9)

The wavelength conversion element according to any of (1) to (8), in which
the phosphor layer and the refrigerant transport member each have an open-cell porous structure, and
an average pore size of the phosphor layer is smaller than an average pore size of the refrigerant transport member.

(10)

The wavelength conversion element according to any of (1) to (9), in which the refrigerant transport member has a flow path on a contact surface with the phosphor layer, the flow path being for transporting the refrigerant.

(11)

The wavelength conversion element according to any of (1) to (10), in which the phosphor layer is directly cooled by latent heat of evaporation for the refrigerant.

(12)

The wavelength conversion element according to any of (1) to (11), in which at least one surface of the housing has light transmissivity, the one surface being opposed to the phosphor layer.

(13)

The wavelength conversion element according to (12), in which the housing includes a heat dissipation member on another surface opposed to the one surface.

(14)

The wavelength conversion element according to (13), in which the refrigerant transport member is disposed on the other surface side of the housing.

(15)

The wavelength conversion element according to any of (1) to (14), in which the housing includes a rotatable wheel member and the phosphor layer has an annular shape.

(16)

The wavelength conversion element according to any of (12) to (15), in which
the phosphor layer is disposed on one surface side of the housing, the one surface having light transmissivity, and
the refrigerant transport member is disposed on another surface side of the housing opposed to the one surface.

(17)

The wavelength conversion element according to (16), in which
the refrigerant transport member has an opening, and
another surface of the housing has water repellency or hydrophilicity, the other surface abutting the opening.

(18)

The wavelength conversion element according any of (1) to (17), in which, in a case where the phosphor layer and the refrigerant transport member are used with respective surfaces of the phosphor layer and the refrigerant transport member standing upright, capillary force (P) in the refrigerant transport member satisfies the following expression (1):

(Expression 1)

$$P \geq \text{hydraulic head difference } R_0 \text{ (mmH}_2\text{O)} \quad (1)$$

($R_0$: distance from a light emitting section in the phosphor layer to an inner side wall of the housing).

(19)

The wavelength conversion element according to any of (12) to (18), in which the phosphor layer has a first surface and a second surface and at least a portion of the first surface is in contact with or is joined to the one surface, the first surface facing the one surface, the second surface being opposed to the first surface.

(20)

The wavelength conversion element according to (19), in which a light emitting region of the first surface is in contact with or is joined to the one surface.

(21)

The wavelength conversion element according to (20), in which the phosphor layer includes a protruding section in the light emitting region of the first surface and the protruding section is in contact with or is joined to the one surface.

(22)

The wavelength conversion element according to (19), in which a whole of the first surface is in contact with or is joined to the one surface.

(23)
The wavelength conversion element according to any of (13) to (22), in which
the phosphor layer has a first surface and a second surface, the first surface facing the one surface, the second surface being opposed to the first surface,
at least a portion of the first surface is in contact with or is joined to the one surface, and
at least a portion of the second surface is in contact with or is joined to the other surface.

(24)
The wavelength conversion element according to (23), in which
the refrigerant transport member has an opening, and
the second surface is in contact with or is joined to the other surface via the opening.

(25)
The wavelength conversion element according to any of (1) to (24), in which a side wall of the housing is sloped.

(26)
The wavelength conversion element according to any of (13) to (25), in which the housing further stores a light source on the other surface side.

(27)
A light source module including:
a light source section; and
a wavelength conversion element that is excited by excitation light from the light source section to emit fluorescent light, in which
the wavelength conversion element includes
a phosphor layer including a plurality of phosphor particles, the phosphor layer having a gap therein,
a refrigerant that cools the phosphor layer,
a refrigerant transport member provided in contact with the phosphor layer, the refrigerant transport member circulating the refrigerant, and
a housing in which the phosphor layer, the refrigerant, and the refrigerant transport member are encapsulated.

(28)
A projection display device including:
a light source module;
a light modulation element that modulates light emitted from the light source module; and
a projection optical system that projects light from the light modulation element, in which the light source module includes
a light source section, and
a wavelength conversion element that is excited by excitation light from the light source section to emit fluorescent light, and
the wavelength conversion element includes
a phosphor layer including a plurality of phosphor particles, the phosphor layer having a gap therein,
a refrigerant that cools the phosphor layer,
a refrigerant transport member provided in contact with the phosphor layer, the refrigerant transport member circulating the refrigerant, and
a housing in which the phosphor layer, the refrigerant, and the refrigerant transport member are encapsulated.

The present application claims the priority on the basis of Japanese Patent Application No. 2018-158129 filed on Aug. 27, 2018 with Japan Patent Office and Japanese Patent Application No. 2019-034421 filed on Feb. 27, 2019 with Japan Patent Office, the entire contents of which are incorporated in the present application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A wavelength conversion element comprising:
a phosphor layer including a plurality of phosphor particles, the phosphor layer having a gap therein;
a refrigerant that cools the phosphor layer;
a refrigerant transport member provided in contact with the phosphor layer, the refrigerant transport member circulating the refrigerant, wherein the refrigerant is circulated by capillary force generated in the phosphor layer and the refrigerant transport member, and wherein a capillary force in the phosphor layer is greater than a capillary force in the refrigerant transport member; and
a housing in which the phosphor layer, the refrigerant, and the refrigerant transport member are encapsulated.

2. The wavelength conversion element according to claim 1, wherein the refrigerant transport member has light reflectivity.

3. The wavelength conversion element according to claim 1, wherein the phosphor layer has space between the phosphor layer and a side wall of the housing.

4. The wavelength conversion element according to claim 1, wherein the phosphor layer has an open-cell porous structure.

5. The wavelength conversion element according to claim 1, wherein the phosphor layer includes a ceramic phosphor.

6. The wavelength conversion element according to claim 1, wherein the refrigerant transport member has an open-cell porous structure.

7. The wavelength conversion element according to claim 1, wherein the refrigerant transport member includes a sintered ceramic compact, a sintered metal, or a porous metal.

8. The wavelength conversion element according to claim 1,
wherein the phosphor layer and the refrigerant transport member each have an open-cell porous structure, and
wherein an average pore size of the phosphor layer is smaller than an average pore size of the refrigerant transport member.

9. The wavelength conversion element according to claim 1, wherein the refrigerant transport member has a flow path on a contact surface with the phosphor layer, the flow path being for transporting the refrigerant.

10. The wavelength conversion element according to claim 1, wherein the phosphor layer is directly cooled by latent heat of evaporation for the refrigerant.

11. The wavelength conversion element according to claim 1,
wherein a top surface of the housing has light transmissivity, and
wherein the top surface of the housing is above the phosphor layer.

12. The wavelength conversion element according to claim 11, wherein the housing includes a heat dissipation member on another surface opposed to the top surface.

13. The wavelength conversion element according to claim 12, wherein the refrigerant transport member is disposed under the phosphor layer.

14. The wavelength conversion element according to claim 12,
wherein the phosphor layer has a first surface and a second surface, the first surface facing the top surface of the housing, the second surface being opposed to the first surface, wherein at least a portion of the first surface is in contact with or is joined to the top surface of the housing, and wherein at least a portion of the second surface is in contact with or is joined to another surface of the housing that is opposed to the top surface.

15. The wavelength conversion element according to claim 14, wherein the refrigerant transport member has an opening, and wherein the second surface is in contact with or is joined to the other surface via the opening.

16. The wavelength conversion element according to claim 12, wherein the housing further stores a light source on a side of the other surface.

17. The wavelength conversion element according to claim 11, wherein the phosphor layer is disposed under the top surface of the housing, the top surface of the housing having light transmissivity, and wherein the refrigerant transport member is disposed under the phosphor layer.

18. The wavelength conversion element according to claim 17, wherein the refrigerant transport member has an opening, and wherein another surface of the housing opposed to the top surface of the housing has water repellency or hydrophilicity, the other surface abutting the opening.

19. The wavelength conversion element according to claim 11, wherein the phosphor layer has a first surface and a second surface and at least a portion of the first surface is in contact with or is joined to the top surface of the housing, the first surface facing the top surface, the second surface being opposed to the first surface.

20. The wavelength conversion element according to claim 19, wherein a light emitting region of the first surface is in contact with or is joined to the top surface of the housing.

21. The wavelength conversion element according to claim 20, wherein the phosphor layer includes a protruding section in the light emitting region of the first surface, and wherein and the protruding section is in contact with or is joined to the top surface of the housing.

22. The wavelength conversion element according to claim 19, wherein a whole of the first surface is in contact with or is joined to the top surface of the housing.

23. The wavelength conversion element according to claim 1, wherein the housing includes a rotatable wheel member and the phosphor layer has an annular shape.

24. The wavelength conversion element according claim 1, wherein with respective surfaces of the phosphor layer and the refrigerant transport member standing upright, the capillary force (P) in the refrigerant transport member satisfies the following expression (1):

(Expression 1)

$$P \geq \text{hydraulic head difference } R0 \text{ (mmH}_2\text{O)} \qquad (1)$$

(R0: distance from a light emitting section in the phosphor layer to an inner side wall of the housing).

25. The wavelength conversion element according to claim 1, wherein a side wall of the housing is sloped.

26. A light source module comprising:

a light source section; and a wavelength conversion element that is excited by excitation light from the light source section to emit fluorescent light, wherein the wavelength conversion element includes:

a phosphor layer including a plurality of phosphor particles, the phosphor layer having a gap therein;

a refrigerant that cools the phosphor layer;

a refrigerant transport member provided in contact with the phosphor layer, the refrigerant transport member circulating the refrigerant, wherein the refrigerant is circulated by capillary force generated in the phosphor layer and the refrigerant transport member, and wherein a capillary force in the phosphor layer is greater than a capillary force in the refrigerant transport member; and a housing in which the phosphor layer, the refrigerant, and the refrigerant transport member are encapsulated.

27. A projection display device comprising:

a light source module;

a light modulation element that modulates light emitted from the light source module; and a projection optical system that projects light from the light modulation element, wherein the light source module includes:

a light source section; and a wavelength conversion element that is excited by excitation light from the light source section to emit fluorescent light, wherein the wavelength conversion element includes:

a phosphor layer including a plurality of phosphor particles, the phosphor layer having a gap therein;

a refrigerant that cools the phosphor layer;

a refrigerant transport member provided in contact with the phosphor layer, the refrigerant transport member circulating the refrigerant, wherein the refrigerant is circulated by capillary force generated in the phosphor layer and the refrigerant transport member, and wherein a capillary force in the phosphor layer is greater than a capillary force in the refrigerant transport member; and a housing in which the phosphor layer, the refrigerant, and the refrigerant transport member are encapsulated.

* * * * *